United States Patent
Toshima et al.

(10) Patent No.: US 9,236,280 B2
(45) Date of Patent: Jan. 12, 2016

(54) SUBSTRATE PROCESSING APPARATUS, SUBSTRATE PROCESSING METHOD, AND STORAGE MEDIUM

(75) Inventors: Takayuki Toshima, Koshi (JP); Mitsuaki Iwashita, Nirasaki (JP); Yuji Kamikawa, Koshi (JP); Mikio Nakashima, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1086 days.

(21) Appl. No.: 13/301,936

(22) Filed: Nov. 22, 2011

(65) Prior Publication Data

US 2012/0132230 A1    May 31, 2012

(30) Foreign Application Priority Data

Nov. 26, 2010  (JP) ................................ 2010-263927

(51) Int. Cl.
*B08B 3/04* (2006.01)
*H01L 21/67* (2006.01)
*H01L 21/02* (2006.01)

(52) U.S. Cl.
CPC ............ *H01L 21/67051* (2013.01); *B08B 3/04* (2013.01); *H01L 21/67017* (2013.01); *H01L 21/6719* (2013.01); *H01L 21/02101* (2013.01)

(58) Field of Classification Search
None
See application file for complete search history.

(56) References Cited

U.S. PATENT DOCUMENTS

| 5,785,736 A | 7/1998 | Thomas |
| 6,344,068 B1 | 2/2002 | Fleming |
| 7,503,334 B1 * | 3/2009 | Shrinivasan .......... B08B 7/0021 134/103.1 |
| 7,704,298 B2 | 4/2010 | Ji |

FOREIGN PATENT DOCUMENTS

JP    2008-72118 A    3/2008

* cited by examiner

*Primary Examiner* — Michael Kornakov
*Assistant Examiner* — Ryan Coleman
(74) *Attorney, Agent, or Firm* — Abelman, Frayne & Schwab

(57) ABSTRACT

Disclosed is a substrate processing apparatus including a processing vessel in which a target substrate W is processed by using a high-pressure fluid in a supercritical state or a subcritical state, and pipes that are divided into a first pipe member and a second pipe member in a flowing direction of the fluid and circulate the fluid are connected to processing vessel. A connecting/disconnecting mechanism moves at least one of first and second pipe members between a connection position and a separation position of first pipe member and the second pipe member, and opening/closing valves are installed in each of first and second pipe members and are closed at the time of separating pipe members.

15 Claims, 14 Drawing Sheets

SUBSTRATE PROCESSING APPARATUS, SUBSTRATE PROCESSING METHOD, AND STORAGE MEDIUM

CROSS-REFERENCE TO RELATED APPLICATIONS

This application is based on and claims priority from Japanese Patent Application No. 2010-263927, filed on Nov. 26, 2010, with the Japanese Patent Office, the disclosure of which is incorporated herein in its entirety by reference.

TECHNICAL FIELD

The present disclosure relates to a technology that processes a substrate to be processed (hereinafter, referred to as a target substrate) by using a high-pressure fluid such as a supercritical fluid or a subcritical fluid.

BACKGROUND

A process of manufacturing a semiconductor device in which a stacking structure of an integrated circuit is formed on the surface of a target substrate such as a semiconductor wafer (hereinafter, referred to as a wafer) includes a process of processing the wafer surface by using a liquid to remove minute dusts or a native oxide layer on the wafer surface with a cleaning liquid such as a chemical liquid.

For example, a single type spin cleaning apparatus that performs wafer cleaning rotates the wafer while supplying an alkaline or acid chemical liquid onto the surface of the wafer by using a nozzle to remove dusts or a native oxide on the wafer surface. In this case, after remaining chemical liquids are removed from the wafer surface by rinse cleaning using deionized water, the wafer surface is dried by a spin drying where the remaining liquids are brushed away while rotating the wafer.

However, with the high integration of the semiconductor device, a problem such as so-called a pattern collapse has grown seriously during the processing of removing the liquids. The pattern collapse is a phenomenon in which the balance of a surface tension horizontally pulling a convex portion is lost, and as a result, the convex portion falls down toward the side where more liquids remain at the time of drying the remaining liquids on the wafer surface, as the remaining liquids at, for example, the left and right sides of the convex portion of concave and convex portions forming a pattern are unevenly dried.

As a technique of removing the remaining liquids on the wafer surface while preventing the pattern collapse from occurring, a drying method using a fluid in a supercritical state or subcritical state (hereinafter, collectively referred to as a high-pressure fluid) has been known. The viscosity of the high-pressure fluid is lower than a liquid while the ability to dissolve thereof is higher than the liquid. Further, there is no interface between the high-pressure fluid and a liquid or a gas that is in equilibrium state with the high-pressure fluid. Therefore, the liquid attached to the wafer is substituted with the high-pressure fluid, and thereafter, when the high-pressure fluid is changed to a gaseous state, the liquid can be dried without being influenced by the surface tension.

Herein, in Japanese Patent Application Laid-Open No. 2008-72118 (see, for example, paragraphs [0025] to [0029], paragraphs [0038] and [0039], and FIG. 1), disclosed is a technology in which a substrate cleaned in a cleaning unit is carried to a dry processing chamber, and thereafter, the pressure in the dry processing chamber is raised, in advance, to be equal to or higher than threshold pressure of a dry processing fluid (in the present exemplary embodiment, carbon dioxide), and thereafter, a supercritical-state dried fluid is supplied to the dry processing chamber to dry the substrate. In the technology, the dried fluid which is subjected to the completion of the processing is discharged from the dry processing chamber and the inside of the dry processing chamber is depressurized to atmospheric pressure, such that the dry processing is terminated.

SUMMARY

According to an exemplary embodiment of the present disclosure, a substrate processing apparatus is provided which includes: a processing vessel configured to perform a processing for a target substrate by using a high pressure fluid while making a raw material to be a high-pressure fluid state in a supercritical state or a subcritical state, or maintaining the high-pressure fluid state of the raw material; a pipe connected to the processing vessel, divided into a first pipe member and a second pipe member in a flowing direction of the fluid, and configured to circulate the fluid; a connecting/disconnecting mechanism configured to move at least one of the first pipe member and the second pipe member between a connection position at which the first pipe member and the second pipe member are connected and a separation position at which the first pipe member and the second pipe member are separated; and opening/closing valves installed in the first pipe member and the second pipe member, respectively and configured to be closed at the time of separating the pipe members.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Figure 1:
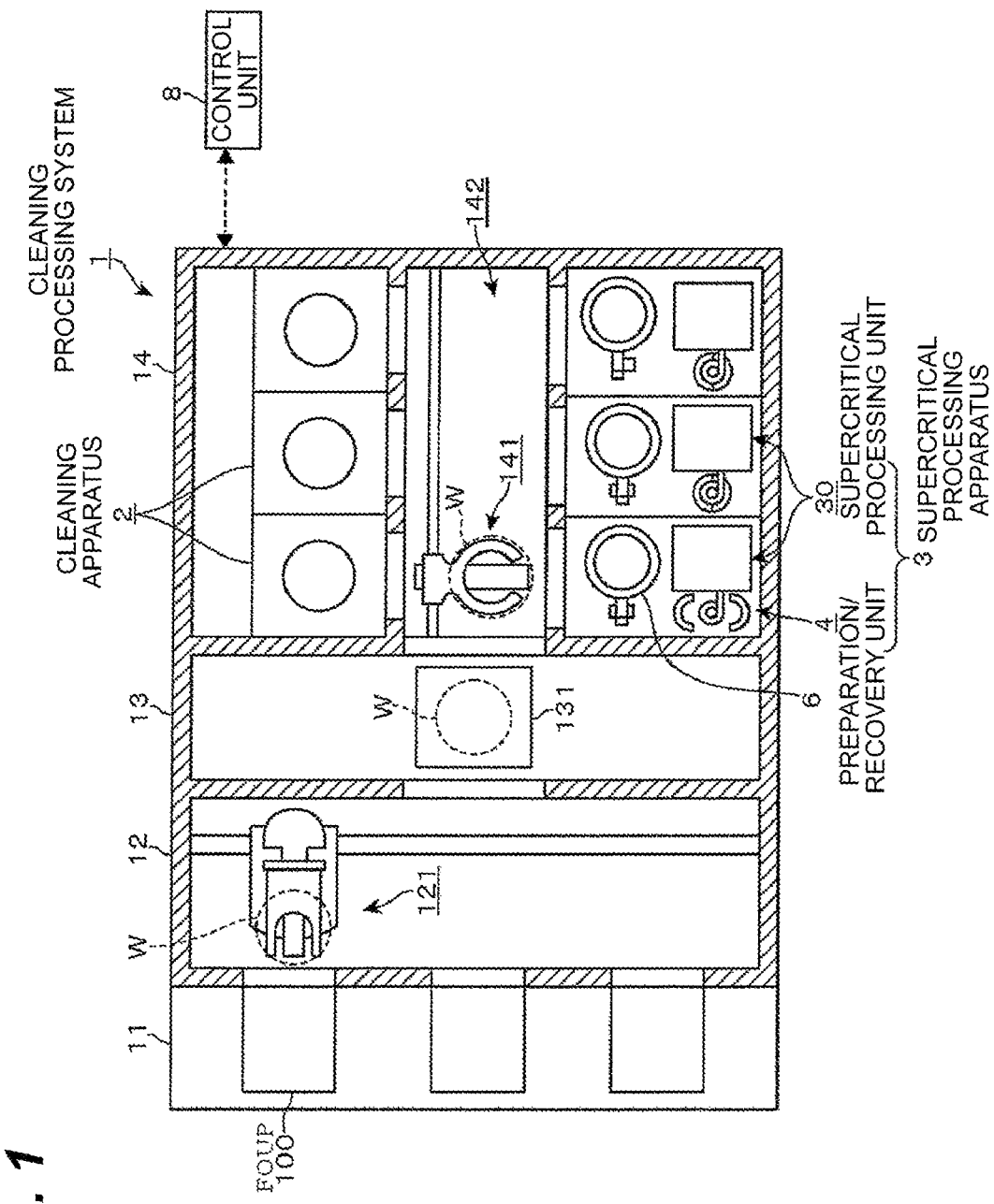
FIG. 1 is a plan view of a cleaning processing system according to an exemplary embodiment.

A pipe (disclosed as a supply nozzle or an outlet in Japanese Patent Application Laid-Open No. 2008-72118 (see, for example, Paragraphs [0025] to [0029] and Paragraphs [0038] and [0039], and FIG. 1)) for supplying a drying fluid is connected to a chamber in which a substrate is dried by using the drying fluid, such that the chamber is connected to a supplying unit or a discharging unit for the drying fluid through the pipe.

However, in the dry processing of a target substrate such as a wafer using the high-pressure fluid, a fluid of which the pressure is raised to the threshold pressure or higher or around the threshold pressure is used, and further, a threshold temperature also becomes a high temperature depending on a kind of the fluid. As a result, when the high-pressure fluid flows out to an upstream side or a downstream side through the pipe connected to a processing vessel, the pressures or temperatures of the areas where the high-pressure fluid flows out are rapidly raised, such that an apparatus may be damaged.

The present disclosure has been made in an effort to provide a substrate processing apparatus, a substrate processing method, and a storage medium storing the method that can prevent a high-pressure fluid from flowing into another apparatus through a pipe installed in a processing vessel in which a processing is performed at the time of processing a target substrate using the high-pressure fluid.

A substrate processing apparatus according to an exemplary embodiment of the present disclosure includes: a processing vessel configured to perform a processing for a target substrate by using a high pressure fluid while making a raw material to be a high-pressure fluid state in a supercritical state or a subcritical state, or maintaining the high-pressure fluid state of the raw material; a pipe connected to the processing vessel, divided into a first pipe member and a second pipe member in a flowing direction of the fluid, and configured to circulate the fluid; a connecting/disconnecting mechanism configured to move at least one of the first pipe member and the second pipe member between a connection position where the first pipe member and the second pipe member are connected and a separation position where the first pipe member and the second pipe member are separated; and opening/closing valves installed in the first pipe member and the second pipe member, respectively and configured to be closed at the time of separating the pipe members.

The substrate processing apparatus may have the following features:

(a) The substrate processing apparatus includes a preparation vessel configured to make the raw material received in a liquid state to be in the high-pressure fluid state and to supply the raw material to the processing vessel; a heating mechanism configured to heat the preparation vessel to make the raw material of the liquid state to be in the high-pressure fluid state; and a cooling mechanism configured to cool the preparation vessel to receive the raw material in the liquid state, and the pipe to circulate the fluid which is provided in the preparation vessel is divided into the first pipe member and the second pipe member in the flowing direction of the fluid and includes a connecting/disconnecting mechanism configured to move at least one of the first pipe member and the second pipe member between the connection position and the separation position of the first pipe member and the second pipe member, and opening/closing valves installed in the first pipe member and the second pipe member, respectively and configured to be closed at the time of separating the pipe members.

(b) A pipe having the connecting/disconnecting mechanism to supply the high-pressure fluid to the processing vessel from the preparation vessel and a pipe having the connecting/disconnecting mechanism to discharge the fluid from the processing vessel after completing the processing of the substrate are communalized, and the preparation vessel also serves as a recovery vessel that recovers the fluid after completing the processing of the target substrate and receives the recovered fluid as the raw material of the liquid state.

(c) A fluid receiving unit with a discharge path to collect and discharge the fluid that flows out at the time of separating the first pipe member and the second pipe member is installed in the pipe.

(d) The fluid receiving unit is configured as a case that partitions the connecting/disconnecting mechanism from a surrounding atmosphere.

(e) The substrate processing apparatus includes a control unit that outputs a control signal to execute a separating operation of separating the pipe members after closing both the opening/closing valves of the first pipe member and the second pipe member and a connecting operation of opening both the opening/closing valves after connecting the pipe members.

(f) The processing performed with respect to the substrate by using the high-pressure fluid is a dry processing of the target substrate.

A substrate processing method according to another exemplary embodiment of the present disclosure comprises: supplying a raw material of a liquid state or a high-pressure fluid state through a pipe to a processing vessel where a target substrate is placed; sealing the processing vessel; dividing and separating the pipe connected to the processing vessel in a flowing direction; processing the target substrate by making the raw material in the processing vessel in a high-pressure fluid state or maintaining the raw material in the high-pressure fluid state; and discharging the fluid after completing the processing of the target substrate from the processing vessel by connecting the pipe to the processing vessel to release the sealing.

The above described method further comprises: installing a preparation vessel configured to make a raw material received in a liquid state to be in the high-pressure fluid state and to supply the raw material to the processing vessel to be connected with the processing vessel; supplying the raw material of the liquid state to the preparation vessel through the pipe; sealing the preparation vessel; dividing and separating the pipe connected to the preparation vessel in the flowing direction; making the raw material of the liquid state to be in the high-pressure fluid state by heating the raw material in the preparation vessel; supplying the high-pressure fluid to the processing vessel form the preparation vessel by connecting the separated pipes; and cooling the preparation vessel in order to receive the raw material in the liquid state.

The above described method further comprises cooling the fluid discharged from the processing vessel and recovering the cooled fluid to the preparation vessel in the liquid state while a pipe for supplying the high-pressure fluid to the processing vessel from the preparation vessel and a pipe for discharging the fluid after completing the processing of the substrate from the processing vessel are communalized.

In the above described method, the processing performed with respect to the substrate by using the high-pressure fluid is a dry processing of the target substrate.

According to yet another exemplary embodiment of the present disclosure, a computer-readable storage medium storing a computer program used in a substrate processing apparatus processing a target substrate by using a high-pressure fluid is provided, wherein the program includes steps to execute the substrate processing method described above.

According to exemplary embodiments of the present disclosure, a pipe connected to a processing vessel where a target substrate is processed using a high-pressure fluid is divided into a first pipe member and a second pipe member in a flowing direction of the fluid and configured to move between a location where the pipe members are connected to each other and another location where the pipe members are separated from each other by using a connecting/disconnecting mechanism. Further, since opening/closing valves installed in the pipe members are closed at the time of separating the first and second pipe members from each other, the high-pressure fluid in the processing vessel can be prevented from flowing into another apparatus through the pipe.

As an example of a substrate processing system having a substrate processing apparatus according to an exemplary embodiment, a cleaning processing system 1 will be described which includes: a cleaning apparatus 2 that cleans a wafer W which is a target substrate by supplying a cleaning fluid to the wafer W, and a supercritical processing apparatus 3 that dries the cleaned wafer W by using a supercritical fluid (a supercritical state fluid) of IPA which is a high pressure-state fluid (a high-pressure fluid).

FIG. 1 is a transverse plan view showing an overall configuration of cleaning processing system 1. When a left side is set as a front with respect to the figure, in cleaning processing system 1, a plurality of sheets of wafers W having a diameter of, for example, 300 mm received in a FOUP 100 loaded on a loading unit 11 are transferred to and from a cleaning processing unit at the rear end thereof through a carrying-in/out unit 12 and a transferring unit 13, and the wafers W are sequentially carried into cleaning apparatus 2 and supercritical processing apparatus 3 to be subjected to a cleaning process or a process by a high-pressure fluid. In the figure, reference numeral 121 represents a first carrying mechanism that carries the wafer W between FOUP 100 and transferring unit 13, and reference numeral 131 represents a transfer rack that serves as a buffer on which the wafer W, which is carried between carrying-in/out unit 12 and a wafer processing unit 14, is temporarily loaded.

In wafer processing unit 14, cleaning apparatus 2 and supercritical processing apparatus 3, which is the substrate processing apparatus according to the exemplary embodiment, are arranged to face each other with a wafer carrying path 142 therebetween. Wafer carrying path 142 extends in a forward/backward direction from an opening portion between wafer processing unit 14 and transferring unit 13. The wafer W is carried among cleaning apparatus 2, supercritical processing apparatus 3, and transferring unit 13 by a second carrying mechanism 141 placed on wafer carrying path 142. Herein, the number of cleaning apparatuses 2 or supercritical processing apparatuses 3 that are disposed in wafer processing unit 14 is properly selected depending on the number of the wafers W processed per unit hour or a difference in processing times in cleaning apparatus 2 and supercritical processing apparatus 3. Further, an optimal layout is selected depending on the number of cleaning apparatuses 2 or supercritical processing apparatuses 3 which are placed.

Figure 2:
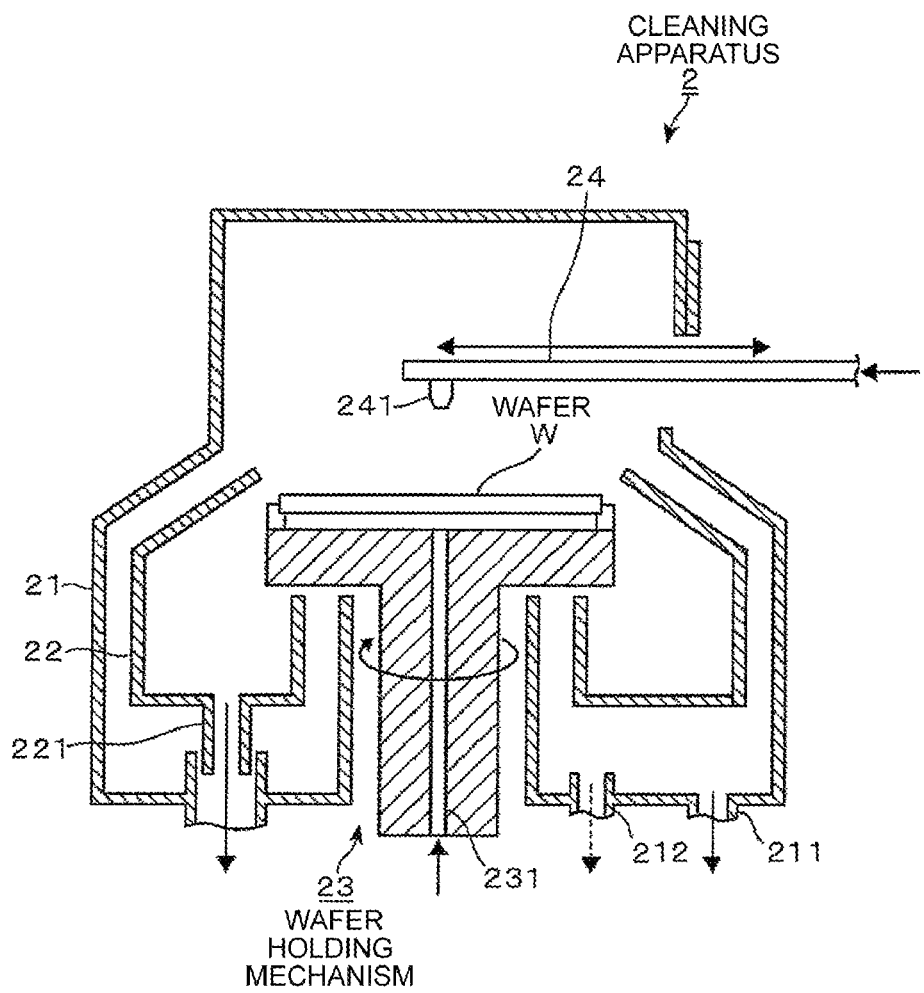
FIG. 2 is a vertical cross-sectional side view showing an example of a cleaning apparatus in the cleaning processing system.

Cleaning apparatus 2 is configured as, for example, a single-type cleaning apparatus 2 to clean each wafer W by a spin washing. As shown in a vertical cross-sectional side view of FIG. 2, the wafer W is held substantially horizontal by a wafer holding mechanism 23 placed in an external chamber 21 forming a processing space, and the wafer W is rotated by rotating wafer holding mechanism 23 on the circumference of the vertical shaft. Further, a nozzle arm 24 enters an upper side of the rotating wafer W to supply a chemical liquid and a rinse solution from a chemical liquid nozzle 241 installed in the front end thereof in a predetermined order to clean the wafer surface. Further, a chemical liquid supplying path 231 is formed in wafer holding mechanism 23 as well, so a back-surface cleaning of the wafer W is made by using the chemical liquid and the rinse solution supplied from chemical liquid supplying path 231.

The cleaning processing is performed, for example, in a sequence including: removal of particles or an organic contaminated material by using an SC1 solution (a mixed solution of ammonia and hydrogen peroxide) which is an alkaline chemical liquid, →rinse cleaning using a rinse solution such as deionized water (DIW), →removal of a native oxide layer using a diluted hydrofluoric acid aqueous solution (hereinafter, diluted hydrofluoric acid (DHF)) which is an acid chemical liquid, →rinse cleaning using the DIW. These chemical liquids are received in an outer chamber 21 or an inner cup 22 placed in outer chamber 21 and discharged from drain holes 221 and 211. Further, an atmosphere in outer chamber 21 is exhausted from an exhaust port 212.

When the cleaning processing by the chemical liquid is terminated, wafer holding mechanism 23 stops to rotate and isopropyl alcohol (IPA) for preventing drying is supplied to the wafer surface to substitute with the DIW remaining on the front surface and the back surface of the wafer W. The wafer W completed with the cleaning processing is transferred to second carrying mechanism 141 by, for example, a transferring mechanism (not shown) installed in wafer holding mechanism 23 just as the IPA is accumulated on the wafer surface to be carried out from cleaning apparatus 2.

Figure 3:
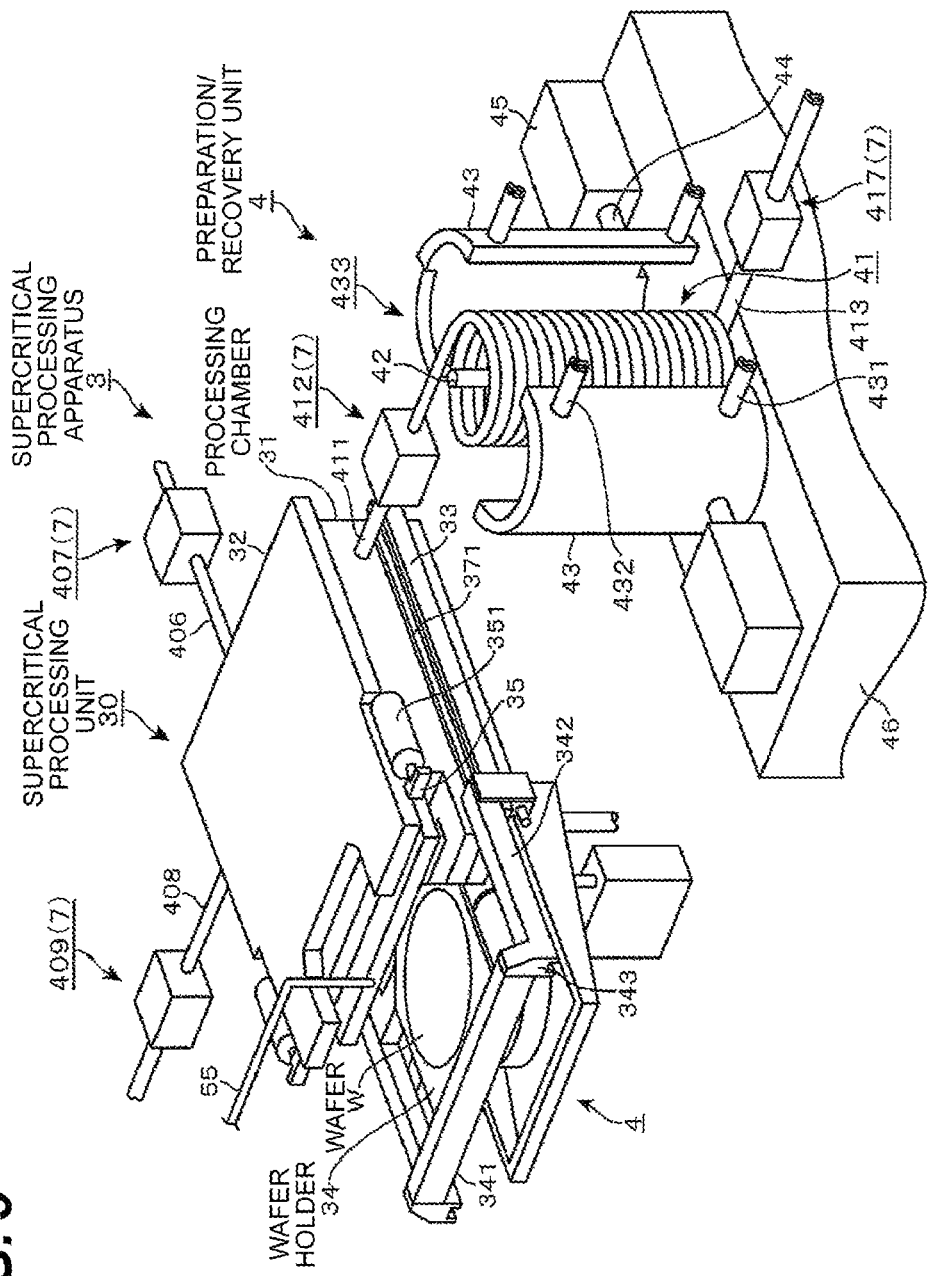
FIG. 3 is a perspective view showing a supercritical processing apparatus according to an exemplary embodiment.
Figure 4:
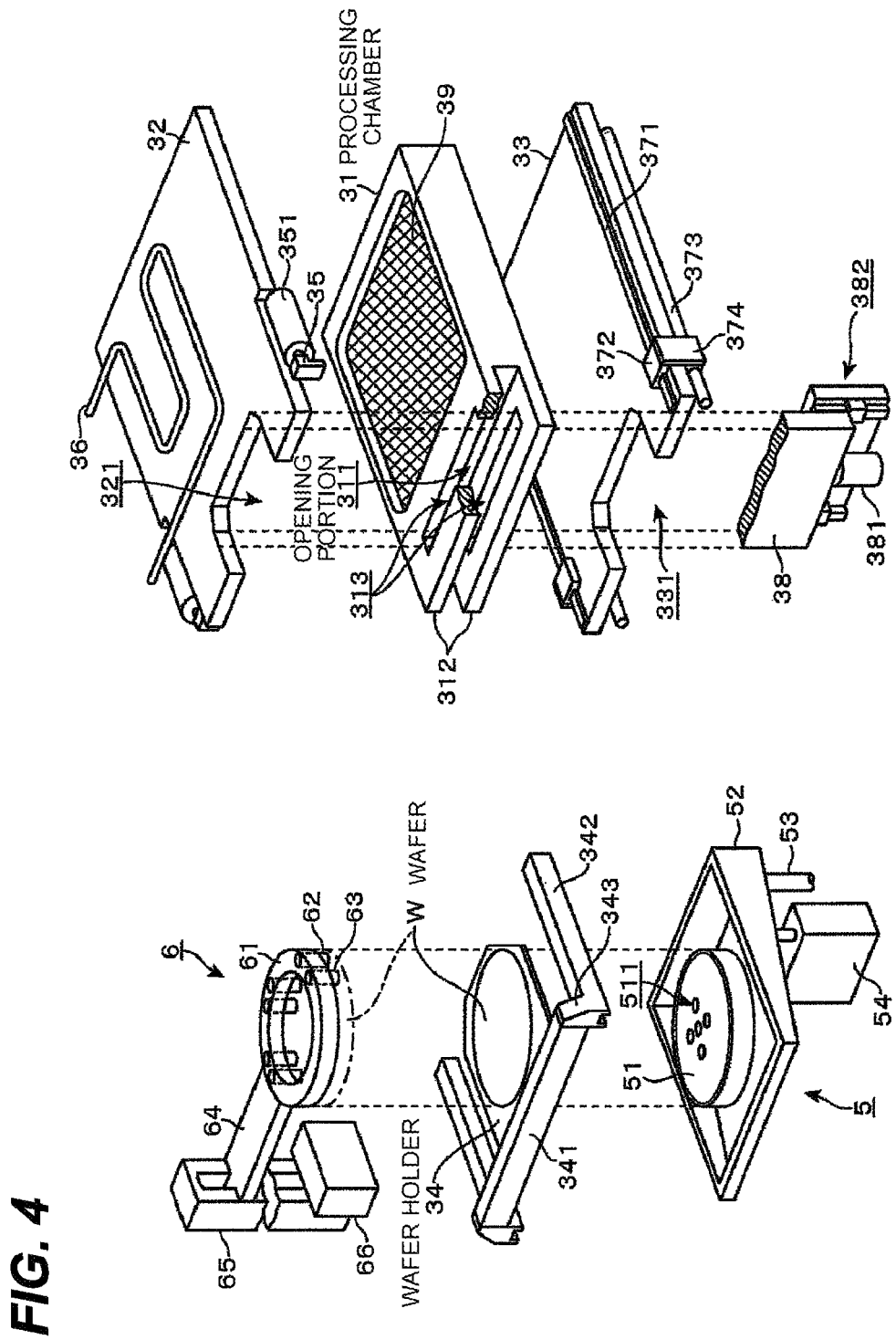
FIG. 4 is an exploded perspective view of the supercritical processing apparatus.

The wafer W completed with the cleaning processing in cleaning apparatus 2 is carried to supercritical processing apparatus 3 with the IPA accumulated on the surfaces thereof and wetted, and thereafter, a supercritical processing is performed in which a liquid is removed from the surface of the wafer W by using the high-pressure fluid and the wafer W is dried. Hereinafter, the configuration of supercritical processing apparatus 3 according to the exemplary embodiment of the present disclosure will be described with reference to FIGS. 3 to 8. In FIGS. 3 and 4, the configuration will be described by setting a left side as a front side with respect to the figures.

As shown in FIG. 1, supercritical processing apparatuses 3 arranged along wafer carrying path 142 are placed in cases which are separated from each other, and a carrying arm 6 that carries the wafer W and supercritical processing apparatus 3 are installed in each case in order thereof from just before.

For example, carrying arm 6 includes a holding ring 61 that holds the wafer W installed at the front end of an arm member 64 extending horizontally, and holding ring 61 is configured elevatably by an elevating mechanism 65 and movably in the forward/backward direction by a moving mechanism 66, as shown in FIG. 4. For example, three pairs of picks 62 and 63 adsorbing and holding three locations of a top periphery of the wafer W are installed in holding ring 61, such that a carry-in pick 62 that holds the wafer W before the processing (unprocessed wafer W) when carrying in the wafer W and a carry-out pick 63 that holds the wafer W after the processing (processed wafer W) when carrying out the wafer W, which are separated from each other, are used.

Next, as shown in FIG. 3, supercritical processing apparatus 3 in the exemplary embodiment includes a supercritical processing unit 30 that processes the wafer W and a preparation/recovery unit 4 that supplies and recovers the high-pressure fluid to and from supercritical processing unit 30. First, supercritical processing unit 30 will be described. In supercritical processing unit 30, the wafer W is transferred to a wafer holder 34 from carrying arm 6 described above to be carried into a processing chamber 31 in which the wafer W is dried by using the high-pressure fluid.

Figure 8:
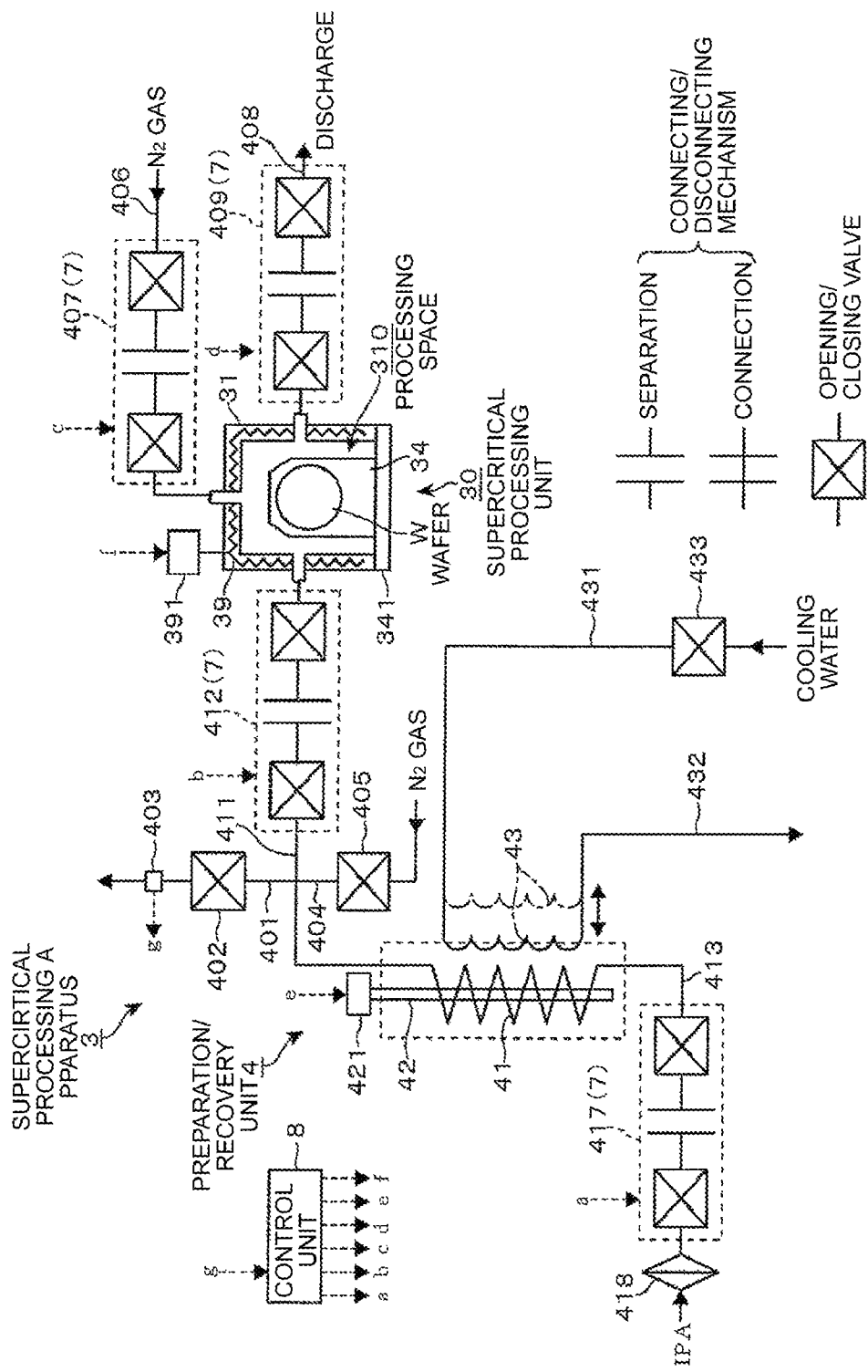
FIG. 8 is an explanatory view showing supplying and discharging systems of a processing fluid to and from the supercritical processing apparatus.

Processing chamber 31 serves as a processing vessel of supercritical processing apparatus 3 according to the exemplary embodiment, and as shown in the exploded perspective view of FIG. 4, processing chamber 31 is configured as a rectangular parallelepiped shaped pressure-resistant vessel which is flat horizontally. A flat processing space 310 capable of receiving wafer holder 34 to hold the wafer W is formed in processing chamber 31 (FIG. 8). Processing space 310 is configured as, for example, a comparatively narrow space having a height in the range of several mm to tens of mm and a volume in the range of 300 $cm^3$ to 1500 $cm^3$ so as to sufficiently circulate the high-pressure fluid between the wafer W and an inner wall of processing chamber 31 and fill the atmosphere in processing space 310 with the high-pressure fluid in a short time while IPA accumulated on the wafer W is not naturally dried, when, for example, the wafer W of 300 mm is processed.

As shown in FIG. 8, a purge gas supplying line 406 and an exhaust line 408 constituting the pipe of the exemplary embodiment are connected to processing chamber 31, such that the IPA that remains in processing space 310 may be purged toward a pretreatment facility installed downstream of the exhaust line by supplying inert gas such as $N_2$ gas into processing space 310 after the processing of the wafer W is completed.

As shown in FIG. 4, an opening portion 311 which is thin and long in the left and right direction, which is used to carry in and out the wafer W, is formed on a front surface of processing chamber 31, and processing chamber 31 is placed in the case with opening portion 311 facing carrying arm 6. Two sheets of flat-type protruded pieces 312 are provided to protrude in a horizontal direction on a surface where opening portion 311 is provided and opening portion 311 is placed at a position at which the top and the bottom are engaged by the two sheets of protruded pieces 312. Reference numeral 313 provided in protruded piece 312 represents an intrusion hole for inserting a lock plate 38 to be described below in an upward and downward direction.

Reference numeral 39 installed on both top and bottom surfaces of processing chamber 31 represents a heater including a resistant heating element such as a tape heater (only the top surface side is shown in FIG. 4 for ease of illustration). As schematically shown in FIG. 8, heater 39 is connected to a power supply unit 391 and the temperatures of a main body of processing chamber 31 and processing space 310 may be at all times maintained to for example, 270° C. in the range of 100° C. to 300° C. by increasing or decreasing the output of power supply unit 391.

Reference numerals 32 and 33 installed on the top and the bottom surfaces of processing chamber 31 are heat-insulating plates that cover heater 39 through a heat insulating material (not shown) to protect various apparatuses installed around from heat and further, prevent the IPA accumulated on the unprocessed wafer W from being evaporated. A cooling pipe 36 that circulates a refrigerant such as cooling water is placed on heat-insulating plates 32 and 33 in order to cool heat-insulating plates 32 and 33.

For example, as shown in FIGS. 3 and 4, heat-insulating plates 32 and 33 are wider than processing chamber 31 in the left and right direction when viewed from the front. A mechanism that holds and drives an arm member 342 to be described below is formed in areas that protrude to the left and right sides of heat-insulating plate 33 on the bottom surface, respectively. That is, reference numeral 371 represents a rail that drives arm member 342, reference numeral 372 represents a slider that is connected to arm member 342 and travels on rail 371, reference numeral 373 represents an actuation mechanism including, for example, a rodless cylinder, which actuates rail 371, and reference numeral 374 represents a connection member that connects actuation mechanism 373 and slider 372 to each other.

Wafer holder 34 is a thin plate type member configured to place the wafer W in processing space 310 of processing chamber 31 while holding the wafer W. Reference numeral 341 provided to the front surface of wafer holder 34 represents a cover member that is inserted into a gap between protruded pieces 312 provided above and below opening portion 311 of processing chamber 31 and covers opening portion 311 to maintain processing space 310 airtightly by pressing down an O-ring (not shown) provided on the periphery of opening portion 311, and reference numeral 342 represents an arm member that travels forward and backward on rail 371 in connection with slider 372 described above to move wafer holder 34 between a transferring position of the wafer W between arm member 342 and carrying arm 6 and a processing position in processing chamber 31 (processing space 310).

Since a lock member 35 and a lock cylinder 351 that rotates lock member 35 are installed in both front left and right areas of heat-insulating plate 32 of the top surface side, protrusion portions 343 provided at the left and right sides of cover member 341 that closes opening portion 311 of processing chamber 31 are engaged with lock member 35 to press down and fix wafer holder 34 onto the side wall surface of processing chamber 31, and otherwise, open cover member 341.

As shown in FIG. 4, a stopper mechanism that stops the opening of cover member 341 closing opening portion 311 is installed just in front of processing chamber 31. That is, reference numeral 38 represents a lock plate that presses cover member 341 inserted into the gap between protruded pieces 312 toward a main body of processing chamber 31 when moving wafer holder 34 up to the processing position, reference numeral 381 represents an elevating mechanism that moves lock plate 38 upward and downward, and reference numeral 382 represents a sliding mechanism that guides a movement direction of lock plate 38 by driving the slider on the rail connected to for example, the bottom of lock plate 38. Herein, for convenience of illustration, in FIG. 3, lock plate 38 or elevating mechanism 381 are not shown.

As shown in FIGS. 3 and 4, a cooling mechanism 5 that cools wafer holder 34 is installed below the transferring position of the wafer W. In cooling mechanism 5, reference numeral 51 represents a cooling plate that discharges clean air for cooling from a discharge hole 511 to cool the wafer W held on wafer holder 34, reference numeral 52 represents a drain pan that receives the IPA that flows down from the wafer W and discharges the received IPA to a drain pipe 53, reference numeral 54 represents an elevating mechanism that moves up drain pan 52 and cooling plate 51 to a cooling position when wafer holder 34 moves to the transferring position and moves down drain pan 52 and cooling plate 51 to a position below the cooling position after wafer holder 34 moves to the processing position.

Reference numeral 55 shown in FIG. 3 represents an IPA nozzle that supplies the IPA to the wafer W which is transferred to wafer holder 34. IPA nozzle 55 supplies the IPA again to the wafer W before the wafer W is transferred to processing chamber 31 so that the wafer W can be transferred to processing chamber 31 with a sufficient amount of the IPA on the surface in order not to be naturally dried.

Preparation/recovery unit 4 is connected to processing chamber 31 described above, and has both a function to prepare for the high-pressure fluid of the IPA to be supplied to processing space 310 inside and a function to recover the IPA completed with the processing. As shown in FIG. 3, preparation/recovery unit 4 includes a spiral pipe 41 that prepares for the supercritical-state IPA to be supplied to processing chamber 31 and further, is formed by winding a pipe recovering the IPA completed with the processing spirally, a halogen lamp 42 that constitutes a heating mechanism to change the IPA inside spiral pipe 41 to the supercritical state by heating spiral pipe 41, a cooling jacket 43 that constitutes a cooling mechanism to condense and recover the IPA supplied to processing chamber 31 in spiral pipe 41 by cooling spiral pipe 41, and a moving mechanism that moves cooling jacket 43 between a cooling position at which spiral pipe 41 is cooled and a position retreated from the cooling position.

Spiral pipe 41 forms a cylinder by winding a pipe member made of stainless spirally in a longitudinal direction and prevents radiation heat of halogen lamp 42 from being leaked to the outside by winding a spiral so that pipes adjacent in the longitudinal direction contact each other. The surface of spiral pipe 41 is painted with, for example, a black radiation heat absorbing paint in order to easily absorb the radiation heat from halogen lamp 42.

As shown in FIG. 3, preparation/recovery unit 4 is placed around supercritical processing unit 30 and spiral pipe 41 is connected to processing chamber 31 through a supply/recovery line 411 forming the pipe of the exemplary embodiment. In supply/recovery line 411, a pipe that supplies the high-pressure fluid to processing chamber 31 and a pipe that recovers the fluid from processing chamber 31 are communalized.

As shown in FIG. 8, a purge gas supplying line 404 that supplies purge gas such as $N_2$ gas to supply/recovery line 411 and a discharge line 401 that discharges the IPA or purge gas supplied to spiral pipe 41 or supply/recovery line 411 toward the pretreatment facility, are connected to supply/recovery line 411. Reference numerals 402 and 405 installed on lines 401 and 404 represent opening/closing valves having pressure resistance and reference numeral 403 installed on discharge line 401 represents a level switch that monitors the amount of IPA supplied from a receiving line 413 of IPA to be described below.

As shown in FIG. 8, receiving line 413 of IPA which is the pipe of the exemplary embodiment extends from the bottom of spiral pipe 41, such that liquid-state IPA which is a raw material of the high-pressure fluid may be received from an IPA supplying unit (not shown). In FIG. 8, reference numeral 418 represents a filter that removes particles in the IPA.

As shown in FIGS. 3 and 8, halogen lamp 42 is a heating lamp having a straight bar shape, which is placed inside the cylinder formed by spiral pipe 41 and is placed on a central axis of the cylinder by being separated from an inner wall surface of the cylinder of spiral pipe 41. A power supply unit 421 is connected to the bottom of halogen lamp 42 through a top panel surface of a supporting stand 46 and spiral pipe 41 is heated by primarily using the radiation heat by emitting heat from halogen lamp 42 by electrical power supplied from power supply unit 421. From this viewpoint, halogen lamp 42 corresponds to a heating mechanism for spiral pipe 41.

As shown in FIG. 3, cooling jacket 43 is a semi-cylindrical member acquired by cutting the cylinder vertically in the up/down direction so as to cover the cylinder formed by spiral pipe 41 from an outer peripheral surface. An inner part of each cooling jacket 43 is formed by a cavity and as mimetically shown in FIG. 8, a refrigerant passage 435 is formed in each cavity, which is configured to circulate the refrigerant that flows toward a cooling water discharging line 432 from a cooling water injection line 431, which are connected to the outer peripheral surface of cooling jacket 43, such as, cooling water of which the temperature is controlled to, for example, 20° C. An inner peripheral surface of cooling jacket 43 constitutes a heat absorbing surface that absorbs heat, and spiral pipe 41 is cooled by contacting the heat absorbing surface with the outer peripheral surface of the cylinder constituted by spiral pipe 41.

A shaft 44 is connected to the outer peripheral surface of each cooling jacket 43 and a driving unit 45 that moves shaft 44 in an axial direction is installed at a base end portion of each shaft 44. Further, spiral pipe 41 may be cooled and stopped from being cooled by moving cooling jacket 43 between a cooling position where the heat absorbing surface contacts spiral pipe 41 and a retreating position where the heat absorbing surface is spaced apart from spiral pipe 41 by extending and shrinking each shaft 44.

Spiral pipe 41 of the exemplary embodiment has both a function as a preparation vessel of the exemplary embodiment in which the IPA that is the raw material is received in the liquid state and the liquid-state IPA is changed to a supercritical state within spiral pipe 41 by heating spiral pipe 41 and a function as a recovery vessel in which IPA supplied to processing chamber 31 is cooled at a temperature which is equal to or lower than a condensation temperature of IPA by cooling jacket 43 to recover IPA supplied to processing chamber 31.

Purge gas supplying line 406, exhaust line 408, and a high-pressure fluid supplying/recovering line 411 connected to processing chamber 31 of supercritical processing unit 30 having the above-mentioned configuration allow the pipes constituting lines 406, 408, and 411 to be separated from each other in a flowing direction to prevent the high-pressure fluid from flowing into a supply system or an exhaust system of the $N_2$ gas, or preparation/recovery unit 4 from processing chamber 31 at the time of processing the wafer W. Further, a pipe constituting receiving line 413 supplying IPA, which is the raw material of the high-pressure fluid, to preparation/recovery unit 4 can also be separated in the flowing direction to prevent the high-pressure fluid from flowing into processing chamber 31 or the IPA supply system at the time of preparing for the high-pressure fluid in association with an operation of supply/recovery line 411.

In supercritical processing apparatus 3 of the exemplary embodiment, a pipe part (hereinafter, referred to as a pipe connecting/disconnecting unit 7) which is configured to be separated in the flowing direction is common to lines 406, 408, 411, and 413 described above. Hereinafter, a configuration and an operation of pipe connecting/disconnecting unit 7 will be described with reference to FIGS. 5 to 7.

Figure 5:
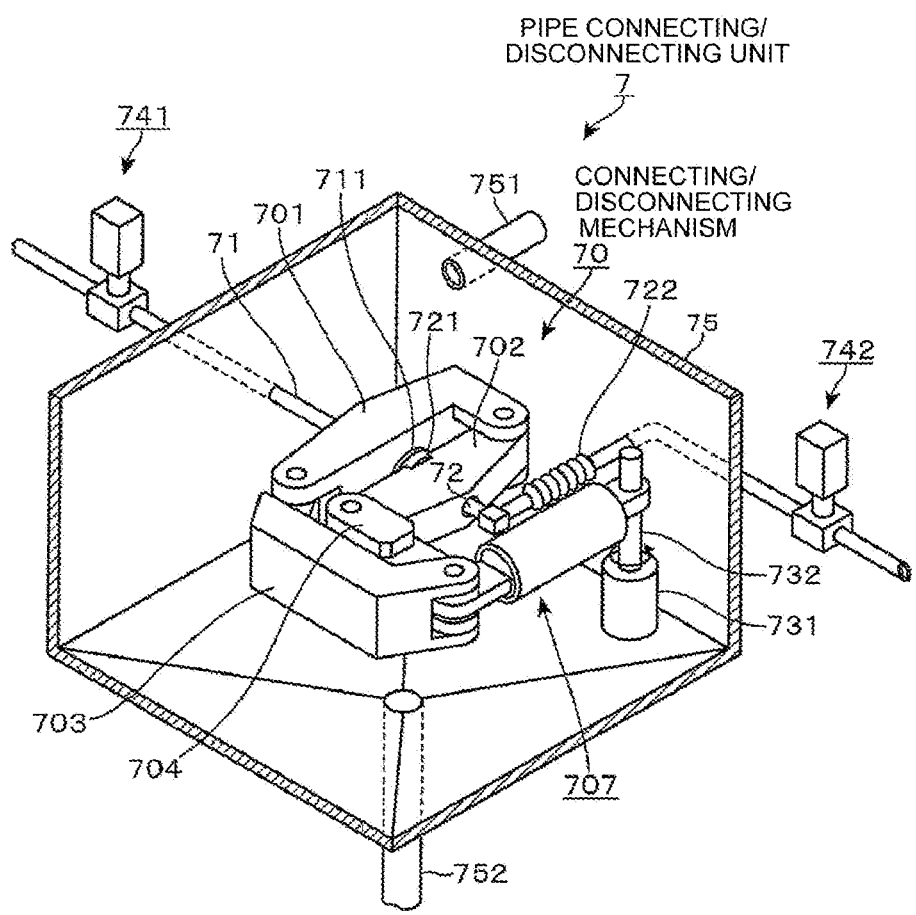
FIG. 5 is a perspective view of a pipe connecting/disconnecting unit installed in a pipe of the supercritical processing apparatus.
Figure 6:
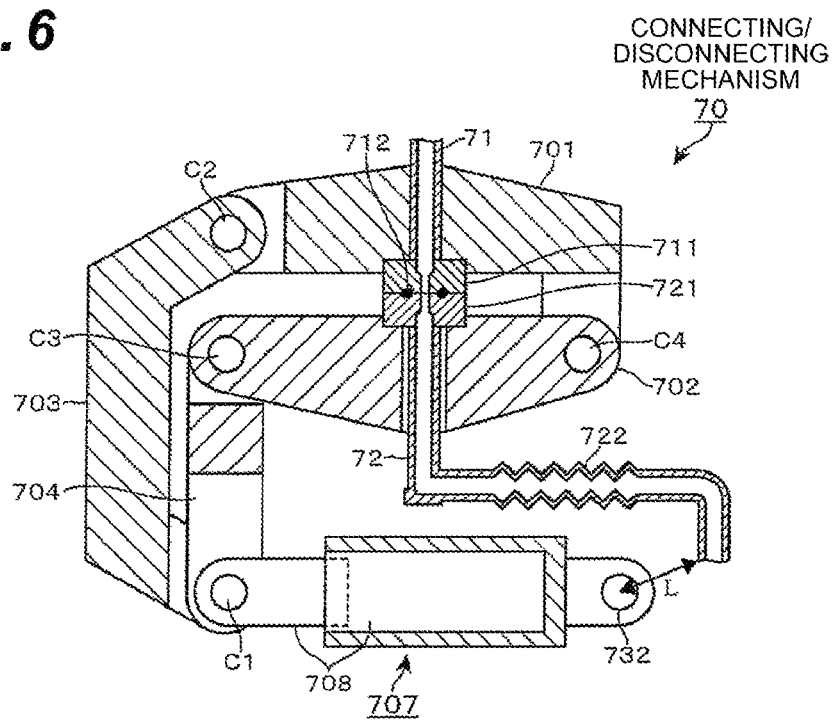
FIG. 6 is a first transverse sectional plan view for describing a configuration and an operation of a connecting/disconnecting mechanism installed in the pipe connecting/disconnecting unit.
Figure 7:
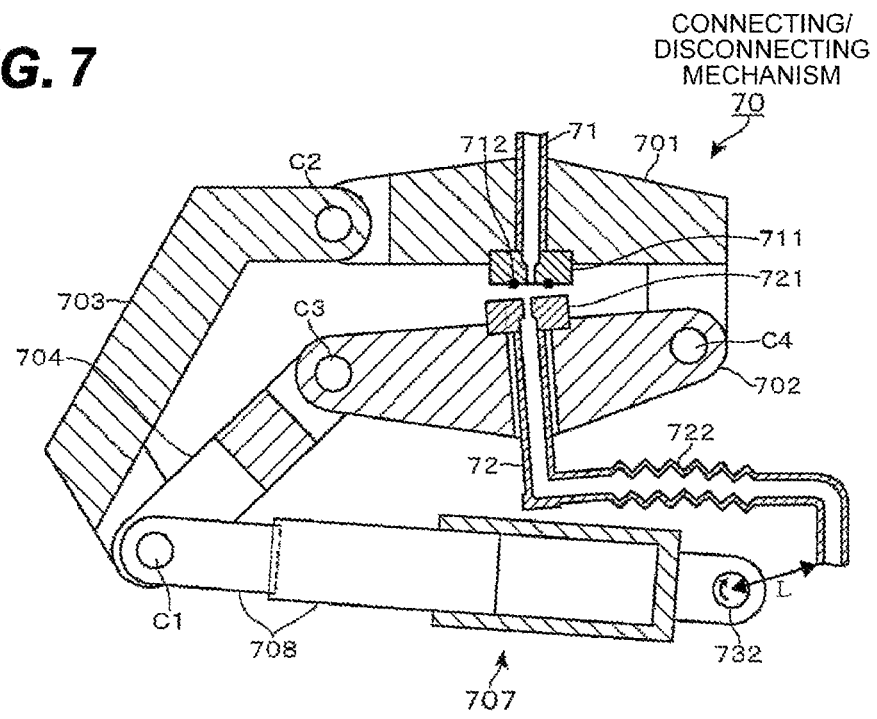
FIG. 7 is a second transverse sectional plan view for describing the configuration and the operation of the connecting/disconnecting mechanism.

As shown in the perspective view of FIG. 5 and the transverse sectional plan views of FIGS. 6 and 7, the each pipe constituting lines 406, 408, 411, and 413 is divided into a first pipe member 71 and a second pipe member 72 in the flowing direction. A first holding member 701 and a second holding member 702 that extend horizontally to be perpendicular to pipe members 71 and 72 are installed at front end portions of divided pipe members 71 and 72, respectively. First pipe member 71 is held by first holding member 701 and second pipe member 72 is held by second holding member 702.

First and second holding members 701 and 702 respectively extending horizontally are placed in parallel to each other and the ends thereof are connected to each other through a rotary shaft C4. Further, two holding members 701 and 702 may allow side wall surfaces facing each other to be spaced apart from or close to each other similar to tweezers around rotary shaft C4.

Flange portions 711 and 721 constituting the end portions of first and second pipe members 71 and 72, respectively protrude from the side wall surfaces of first and second holding members 701 and 702 that face each other, such that when both holding members 701 and 702 are close to a predetermined position, flange portions 711 and 721 face each other to connect first pipe member 71 and second pipe member 72. Reference numeral 712 shown in FIGS. 6 and 7 represents an O-ring that closely contacts flange portions 711 and 721 to each other.

Meanwhile, crank members 703 and 704 having different lengths are connected to holding members 701 and 702 through rotary shafts C2 and C3, respectively, at an end portion which is opposite to the end portion connected through rotary shaft C4. When first and second pipe members 71 and 72 are connected to each other, each of crank members 703 and 704 extends horizontally in a direction perpendicular to corresponding one of holding members 701 and 702 (a direction in which each of pipe members 71 and 72 penetrating corresponding one of holding members 701 and 702 extends) to be connected to a front end portion of a rod 708 installed in a common extending rod part 707 through a rotary shaft C1.

When first and second pipe members 71 and 72 are connected, extending rod part 707 extends from rotary shaft C1 horizontally to be parallel to each of holding members 701 and 702 and a base end portion thereof is connected to a rotary shaft 732 extending vertically. A rotational angle of rotary shaft 732 may be controlled arbitrarily by a rotary motor 731 and rotary shaft 732 may be stopped to rotate at a desired position by rotary motor 731.

In a connecting/disconnecting mechanism 70 having the above-mentioned configuration, as shown in FIG. 7, in the case where rotary shaft 732 rotates in a right direction when viewed from the top, the front end portion of rod 708 installed in extending rod part 707 is close to holding members 701 and 702. Since crank members 703 and 704 are connected to the front end portion of rod 708, a force to rotate extending rod part 707 is converted into a force to take out rod 708 from extending rod part 707 and a force to rotate crank members 703 and 704 around rotary shaft C1.

In this case, since crank members 703 and 704 connected to each of holding members 701 and 702 have different lengths, a rotary amount when rod 708 moves to a predetermined position is small in long crank member 703 and large in short crank member 704. As a result, front ends of crank members 703 and 704 move to different positions and first and second holding members 701 and 702 connected to crank members 703 and 704 move in a direction in which the first and second holding members 701 and 702 are separated from each other to thereby separate the first and second pipe members from each other.

In connecting/disconnecting mechanism 70 of the exemplary embodiment, a placement position of first holding member 701 is fixed and when rotary shaft 732 rotates, second holding member 702 moves around rotary shaft C4 as a rotational center. As shown in FIGS. 5 to 7, second pipe member 72 penetrating second holding member 702 is bent in an L shape to extend horizontally to be parallel to each of holding members 701 and 702 in a direction opposite to the placement position of crank members 703 and 704 in order to prevent interference with extending rod part 707. In the area of second pipe member 72, which extends in parallel to each of holding members 701 and 702, for example, a bellows-shaped flexible pipe portion 722 is installed. Further, as shown in FIG. 7, when first and second pipe members 71 and 72 are separated from each other, flexible pipe portion 722 is bent to absorb the displacement of second holding member 702. As a result, for example, as shown by a symbol of 'L' in FIGS. 6 and 7, the placement position of second pipe member 72 is not changed in an area outside of flexible pipe portion 722 before and after both pipe members 71 and 72 are connected with and disconnected from each other.

As shown in FIG. 6, when first and second pipe members 71 and 72 are connected, rotary shaft 732 is fixed not to rotate in counterclockwise when viewed from the top, such that holding members 701 and 702 facing each other are supported by crank members 703 and 704. As a result, even though the high-pressure fluid flows into the pipe constituted by first and second pipe members 71 and 72, a force actuated to separate holding members 701 and 702 by receiving internal pressure by the high-pressure fluid is received in crank members 703 and 704, such that the force is not actuated in a direction to bend flexible pipe portion 722. Therefore, even though first and second pipe members 71 and 72 are divided in the flowing direction, the high-pressure fluid may flow in pipe connecting/disconnecting unit 7 without the leakage of the internal fluid.

Herein, in connecting/disconnecting mechanism 70 of the exemplary embodiment, in particular, the flowing direction is not designated and any one of first pipe member 71 and second pipe member 72 of connecting/disconnecting mechanism 70 may be placed to be an upstream side. However, for ease of description, in the exemplary embodiment, when IPA or N2 gas is supplied toward processing chamber 31 or spiral pipe 41 (except for a case where IPA is recovered to spiral pipe 41 from processing chamber 31), first pipe member 71 is placed at the upstream side of the flowing direction and second pipe member 72 is placed at a downstream side.

As shown in FIG. 5, opening/closing valves 741 and 742 having pressure resistance are installed in first and second pipe members 71 and 72, such that opening/closing valves 741 and 742 are closed when both pipe members 71 and 72 are separated from each other to prevent the fluid in the pipe from being leaked. Further, as shown in FIGS. 1 and 5, since connecting/disconnecting mechanism 70 described above is entirely covered by a case-type fluid receiving unit 75, even when the fluid that exists between opening/closing valves 741 and 742 is leaked when separating first and second pipe members 71 and 72, the leaked fluid can be collected to be discharged to the outside.

Reference numeral 751 connected to fluid receiving unit 75 represents a purge gas supplying line through which purge gas such as clean air is supplied in order to exhaust an atmosphere in fluid receiving unit 75, and reference numeral 752 represents a discharge line through which a liquid or gas in fluid receiving unit 75 is discharged. An inclined surface that is lowered toward a position where the discharge line is installed is formed on the bottom surface of fluid receiving unit 75.

As described above, referring to FIGS. 5 to 7, although the configuration example of connecting/disconnecting mechanism 70 installed in pipe connecting/disconnecting unit 7 has been described in detail, it is emphasized that connecting/disconnecting mechanism 70 is not limited to the above-mentioned example as long as connecting/disconnecting mechanism 70 has the function to separate and connect first pipe member 71 and second pipe member 72 formed by dividing the pipe in the flowing direction of the fluid from and to each other. For example, first pipe member 71 and second pipe member 72 may be connected to each other through a socket and any one side of pipe members 71 and 72 is taken out from the socket to separate both pipe members 71 and 72 from each other, and pipe members 71 and 72 may be separated and connected from and to each other by another configuration.

When a member that flows in the pipe is a liquid having low volatility unlike IPA, a pan type fluid receiving unit 75 having only the discharge line may be configured instead of case-type fluid receiving unit 75, such that connecting/disconnecting mechanism 70 may be placed thereabove.

Cleaning processing system 1 including supercritical processing apparatus 3 having the above-mentioned configuration is connected to a control unit 8 as shown in FIGS. 1 and 8. Control unit 8 includes, for example, a computer including a CPU and a memory unit (not shown). A program is recorded in the memory unit. The program is implemented with grouped steps (commands) relating to the control associated with the operations of cleaning processing system 1 or cleaning apparatus 2 and supercritical processing apparatus 3, that is, the control of the operations, where the wafer W is taken out from FOUP 100 and is cleaned in cleaning apparatus 2, the wafer W is subjected to drying in supercritical processing apparatus 3, and the wafer W is carried into FOUP 100. This program is stored in recording media such as a hard disk, a compact disk, a magnet optical disk, and a memory card and installed in the computer therefrom.

In particular, in regards to the operations of supercritical processing apparatus 3, control unit 8 is connected to connecting/disconnecting mechanism 70 and opening/closing valves 741 and 742 of pipe connecting/disconnecting units 407, 409, 412, and 417 installed on lines 406, 408, 411, and 413 as shown in FIG. 8. Further, a control signal is outputted to separate pipe members 71 and 72 after closing both opening/closing valves 741 and 742 when a separating operation of separating first and second pipe members 71 and 72 is performed, and open both opening/closing valves 741 and 742 after connecting pipe members 71 and 72 when a connecting operation of connecting both pipe members 71 and 72 is performed.

Control unit 8 is connected to a level switch 403 installed in discharge line 401, power supply unit 421 of halogen lamp 42, or power supply unit 391 of heater 39 to serve to control a supplying timing or a supply amount of IPA and a supplying/stopping timing and a supply amount of the electrical power. Further, control unit 8 acquires a temperature detection result in spiral pipe 41 from a temperature detecting unit (not shown) which is installed in spiral pipe 41 to heat or cool spiral pipe 41 based on the result.

The operation of supercritical processing apparatus 3 having the above-mentioned configuration will be described with reference to FIGS. 9 to 16. In the figures, the symbol 'S' added to each opening/closing valve represents a closed state of the opening/closing valve and the symbol 'O' represents an opened state of the opening/closing valve.

As described above, when the cleaning processing is completed in cleaning apparatus 2 and the wafer W accumulated with IPA for preventing the dry is transferred to second carrying mechanism 141, second carrying mechanism 141 enters the case where supercritical processing apparatus 3 capable of receiving the wafer W is placed to thereby transfer the wafer W to carrying arm 6, for example, based on a predetermined processing schedule.

Figure 9:
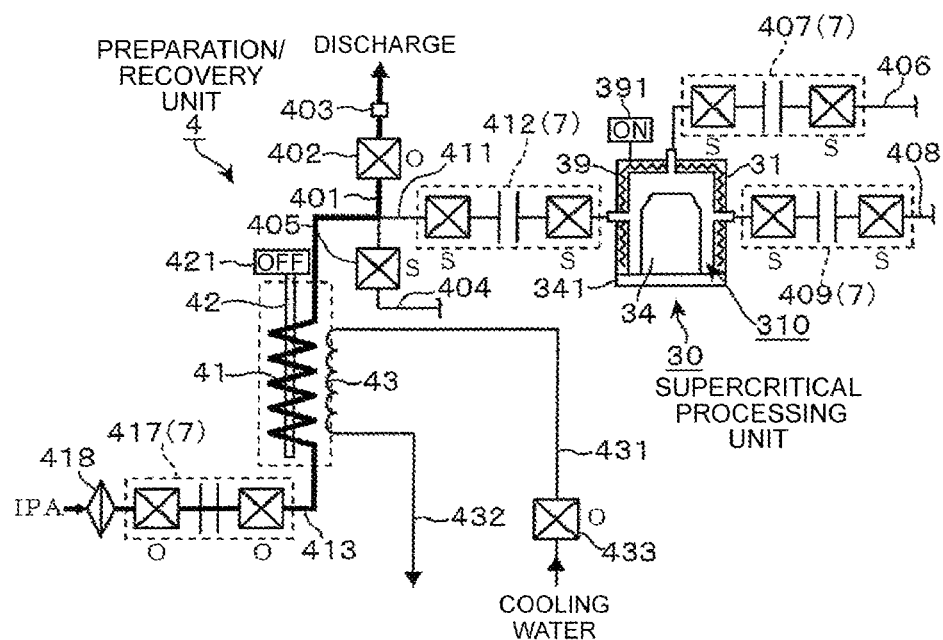
FIG. 9 is a first explanatory view showing an operation of the supercritical processing apparatus.

In this case, supercritical processing unit 30 before the wafer W is carried in heats the main body of processing chamber 31 to, for example, 270° C. by heater 39 by turning on power supply unit 391 of processing chamber 31 as shown in FIG. 9. Meanwhile, an upper plate 32 and a lower plate 33 installed above and below processing chamber 31 are cooled by cooling pipe 36 to prevent a surrounding temperature of processing chamber 31 from being excessively increased, thereby preventing IPA supplied to the surface of the wafer W on wafer holder 34 from being evaporated.

In preparation/recovery unit 4, power supply unit 421 of halogen lamp 42 is turned OFF and spiral pipe 41 is cooled by moving cooling jacket 43 to the cooling position, for example, at a timing before an initial processing starts in supercritical processing apparatus 3. Meanwhile, in the present exemplary embodiment, while supercritical processing apparatus 3 is actuated, the cooling water is supplied to cooling jacket 43 at all times.

In this case, in pipe connecting/disconnecting units 407, 409, and 412 installed on all the lines 406, 408, and 411 connected to processing chamber 31, first and second pipes 71 and 72 are separated from each other by connecting/disconnecting mechanism 70 (hereinafter, referred to as a separation state) and processing chamber 31 is separated from the supply and discharge systems of IPA or $N_2$ gas.

Meanwhile, in preparation/recovery unit 4, first and second pipe members 71 and 72 are connected (hereinafter, referred to as a connection state) by actuating connecting/disconnecting mechanism 70 of pipe connecting/disconnecting unit 417 of receiving line 413 of IPA to receive the liquid-state IPA toward spiral pipe 41 from the IPA supplying unit (not shown). In this case, opening/closing valve 402 installed on discharge line 401 is opened, such that the atmosphere in spiral pipe 41 pushed by the IPA is exhausted through discharge line 401.

Figure 10:
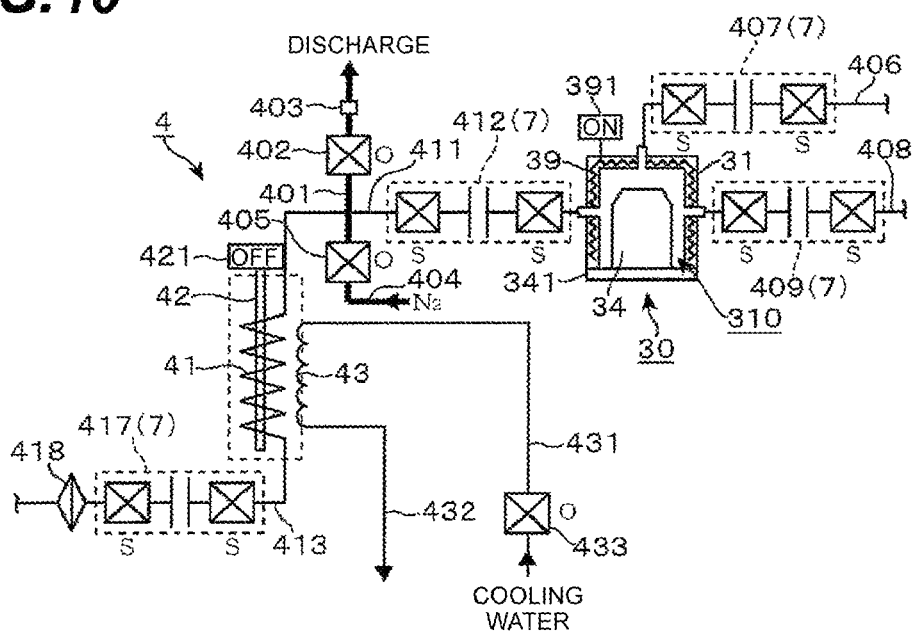
FIG. 10 is a second explanatory view showing the operation of the supercritical processing apparatus.
Figure 17:
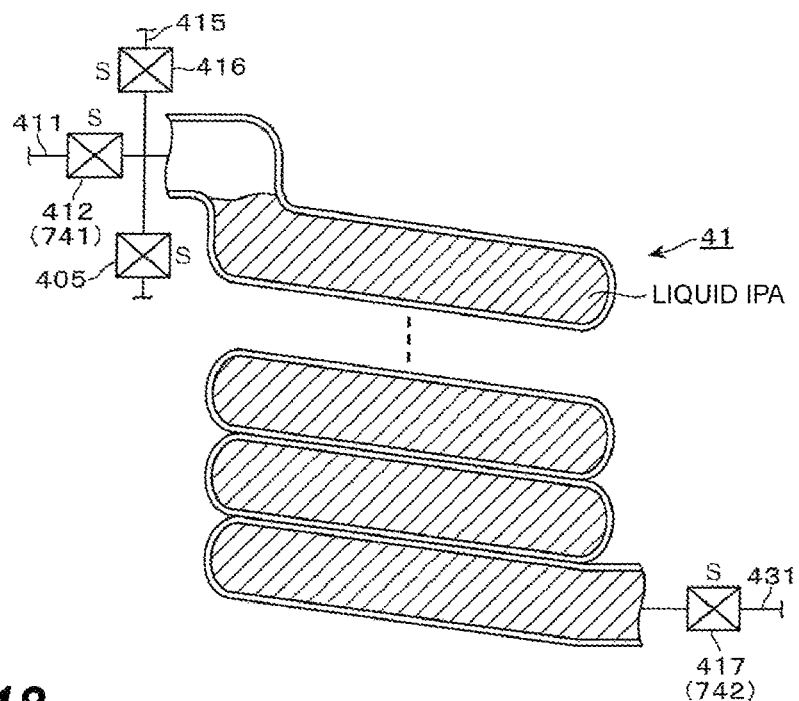
FIG. 17 a first explanatory view showing an internal shape of a spiral pipe provided in a preparation/recovery unit.

When the liquid-state IPA is filled in spiral pipe 41 and a liquid level thereof is detected by level switch 403 of discharge line 401, the IPA stops to be supplied to keep pipe connecting/disconnecting unit 417 of receiving line 413 in the separation state as shown in FIG. 10. Continuously, N₂ gas is supplied from purge gas supplying line 404 by opening opening/closing valve 405 of purge gas supplying line 404 to discharge the IPA stored throughout supply/recovery line 411 from the top of spiral pipe 41. By this operation, an expansion space of the IPA is secured when the IPA is heated, as shown in FIG. 17.

Figure 11:
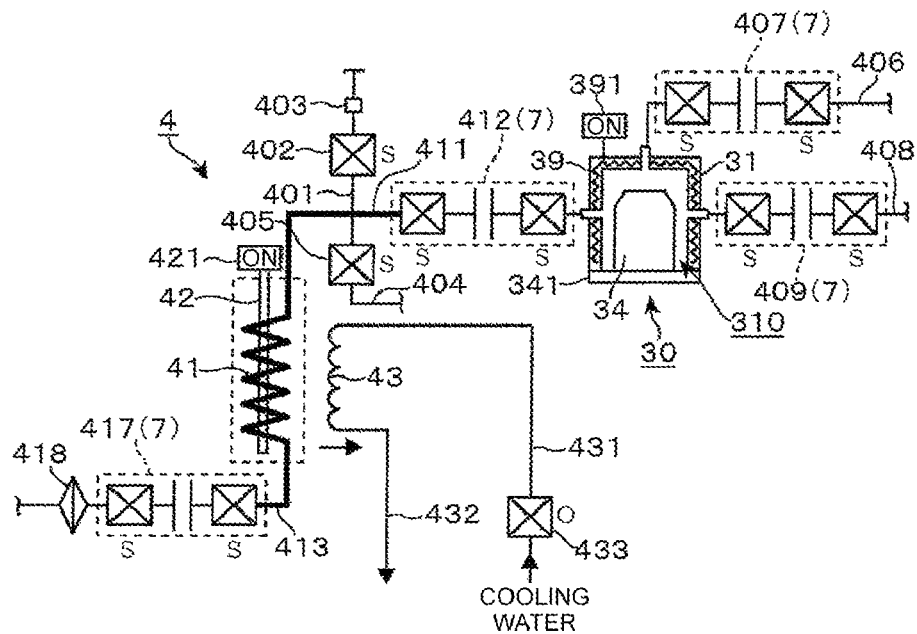
FIG. 11 is a third explanatory view showing the operation of the supercritical processing apparatus.

Therefore, when a small amount of liquid IPA enters spiral pipe 41, as shown in FIG. 11, spiral pipe 41 is heated to, for example, 270° C. in the range of 100° C. to 300° C. by moving cooling jacket 43 to the retreating position, and supplying the electrical power to halogen lamp 42 by turning on power supply unit 421 to emit heat. In this case, as already described above, pipe connecting/disconnecting units 412 and 417 installed at upstream and downstream sides of spiral pipe 41 are separated from each other and further, opening/closing valves 402 and 405 of discharge line 401 and purge gas supplying line 404 are also closed. As a result, the inner part of spiral pipe 41 is subjected to an airtight atmosphere and when spiral pipe 41 is heated, the IPA is evaporated to become gas, such that the internal pressure of spiral pipe 41 increases with the expansion of the volume of the IPA.

Figure 18:
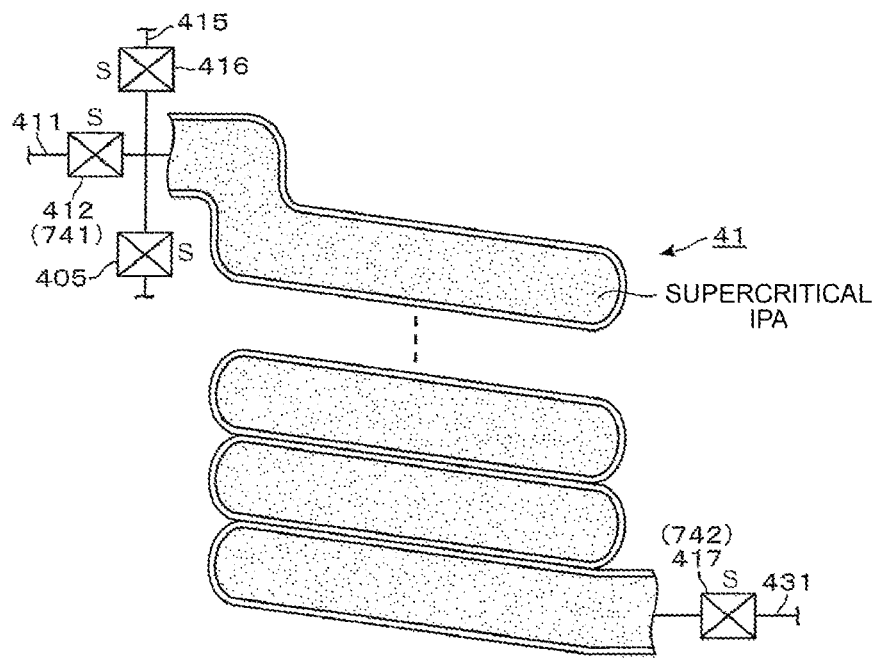
FIG. 18 is a second explanatory view showing the internal shape of the spiral pipe.

When the temperature and pressure of the IPA are increased by continuing heating in an airtight atmosphere, the temperature and pressure of the IPA reach threshold points, such that the inner part of spiral pipe 41 is filled with supercritical-state IPA as shown in FIG. 18. Therefore, when preparation for the IPA for performing the supercritical processing is made, preparation/recovery unit 4 stands by while controlling the output of halogen lamp 42 to maintain the temperature and pressure in spiral pipe 41 to predetermined values.

Along with these operations, in supercritical processing unit 30, carrying arm 6 transfers the wafer W to wafer holder 34 which stands by at the transferring position and thereafter, carrying arm 6 retreats from the position above wafer holder 34. Further, as shown in FIG. 3, the IPA is supplied onto the surface of the wafer W from IPA nozzle 55 to accumulate the IPA again. When the accumulation of the IPA is completed, cooling plate 41 moves down to the lower position and arm member 342 slides on rail 371 to move wafer holder 34 up to the processing position. In addition, lock member 35 rotates to be coupled with protrusion portions 343, such that when opening portion 311 of processing chamber 31 is closed by cover member 341, a lock plate 38 moves up to a lock position from the lower position to press cover member 341 just in the front.

Figure 12:
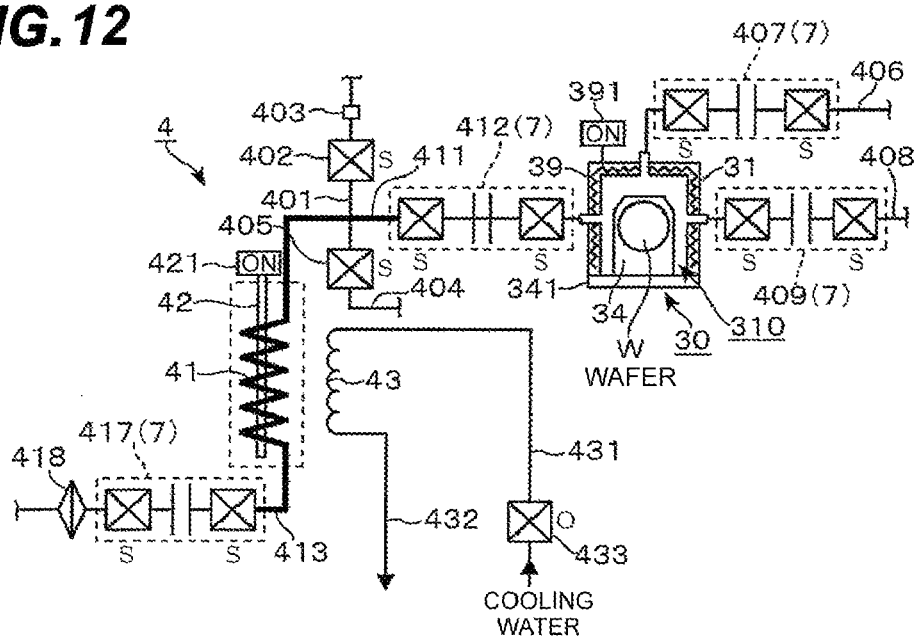
FIG. 12 is a fourth explanatory view showing the operation of the supercritical processing apparatus.

With the transferring operation of the wafer W described above, in pipe connecting/disconnecting unit 412 of supply/recovery line 411, first and second pipe members 71 and 72 are first connected to each other by actuating connecting/disconnecting mechanism 70, when the wafer W is carried into processing chamber 31 while two opening/closing valves 741 and 742 are closed as it is, preparation for immediately supplying the high-pressure fluid (supercritical-state IPA) is made. That is, at this timing, as shown in FIG. 12, supercritical processing unit 30 carries the wafer W into processing space 310 of processing chamber 31, and further, preparation/recovery unit 4 prepares for drying the wafer W as the high-pressure fluid is provided in spiral pipe 41.

When the carrying of the wafer W into processing space 310 is completed to lock cover member 341, the high-pressure fluid is supplied toward processing space 310 from spiral pipe 41 while opening opening/closing valves 741 and 742 of pipe connecting/disconnecting unit 412 of supply/recovery line 411 before the IPA accumulated on the surface of the wafer W is dried.

Figure 13:
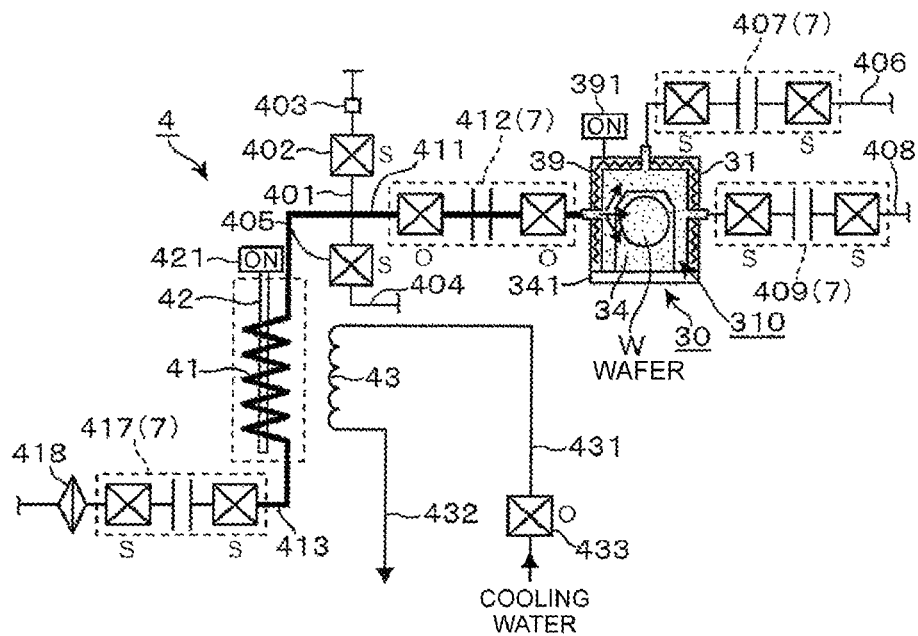
FIG. 13 is a fifth explanatory view showing the operation of the supercritical processing apparatus.

Therefore, when opening/closing valves 741 and 742 are opened, the high-pressure fluid in spiral pipe 41 is expanded to flow into processing space 310 through supply/recovery line 411, as shown in FIG. 13. In this case, by (1) maintaining the temperature and pressure of the high-pressure fluid provided in spiral pipe 41 to be remarkably higher than a threshold temperature and a threshold pressure, (2) preventing an expansion rate of the high-pressure fluid by maintaining the volume of processing space 310 of processing chamber 31 and the volume of supply/recovery line 411 at processing chamber 31 side than opening/closing valve 412 to be smaller as possible, and (3) expanding the high-pressure fluid to be a state close to isothermal and isobaric expansion by pre-heating processing space 310 by using heater 39 and increasing the output of halogen lamp 42 to maintain the temperature and pressure in spiral pipe 41 substantially similarly before and after opening opening/closing valve 412, the high-pressure fluid may be supplied into processing space 310 while maintaining the supercritical state.

When the high-pressure fluid supplied into processing space 310 contacts the IPA accumulated on the wafer W, the accumulated IPA is evaporated by acquiring heat from the high-pressure fluid to become the supercritical state. As a result, the surface of the wafer W is replaced as the high-pressure fluid from the liquid IPA. In this case, since there is no interface between the liquid IPA and the high-pressure fluid in an equilibrium state, the fluid on the surface of the wafer W may be replaced as the high-pressure fluid without causing a pattern collapse. In this case, pipe connecting/disconnecting units 407 and 409 of purge gas supplying line 406 and exhaust line 408 are separated from processing space 310 to prevent the high-pressure fluid from being leaked into lines 406 and 408.

Figure 14:
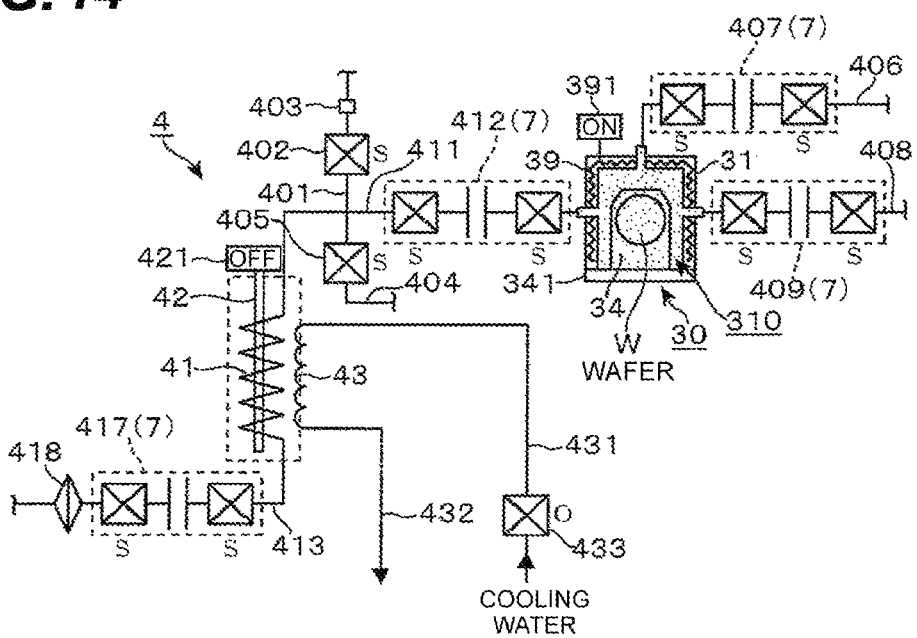
FIG. 14 is a sixth explanatory view showing the operation of the supercritical processing apparatus.

In supply/recovery line 411, pipe connecting/disconnecting unit 412 is in the separation state as shown in FIG. 14 and power supply unit 421 is turned OFF to stop the heating of spiral pipe 41 by using halogen lamp 42. Subsequently, the inner part of spiral pipe 41 is cooled so that the internal temperature of spiral pipe 41 is equal to or lower than the condensation temperature of IPA by moving cooling jacket 43 to the cooling position. By cooling spiral pipe 41 which is in an airtight state, the inner part of spiral pipe 41 becomes in a depressurizing atmosphere.

Figure 15:
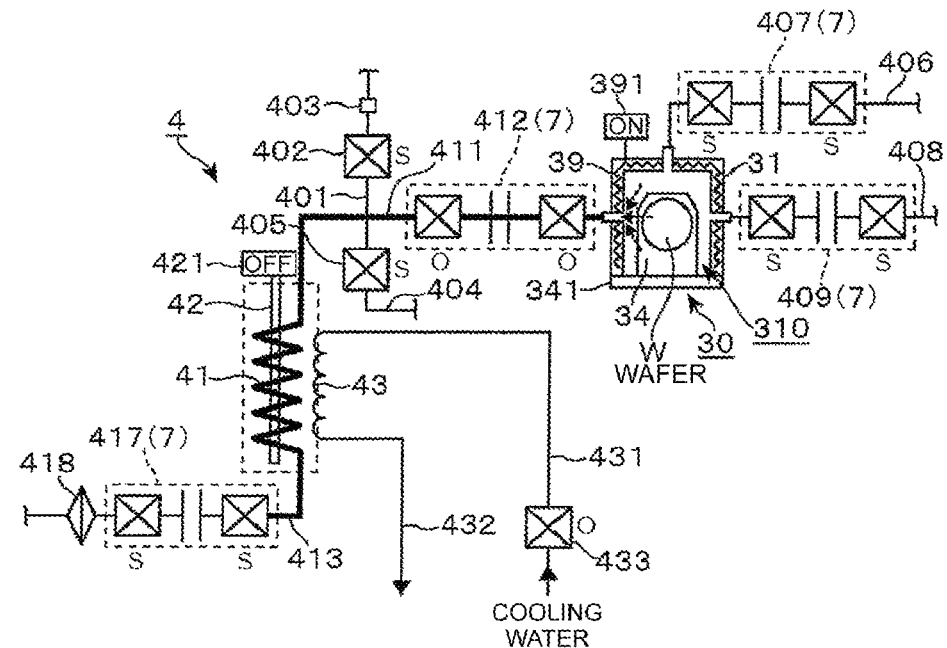
FIG. 15 is a seventh explanatory view showing the operation of the supercritical processing apparatus.

Therefore, when a predetermined time elapses after the high-pressure fluid is supplied into processing space 310 and the surface of the wafer W is substituted with the high-pressure fluid, pipe connecting/disconnecting unit 412 of supply/recovery line 411 becomes in the connection state as shown in FIG. 15. As a result, the IPA flows into spiral pipe 41 with the depressurized atmosphere from processing space 310 with a high-pressure atmosphere through supply/recovery line 411, and the IPA that flows in is sequentially condensed to be in the liquid state and accumulated in spiral pipe 41.

Therefore, when the IPA is recovered to spiral pipe 41 in the liquid state, the pressure in processing chamber 31 decreases gradually. Meanwhile, since the temperature in processing space 310 is maintained to be higher than a boiling point (82.4° C.) of the IPA under normal pressure, the IPA in processing space 310 is changed from the supercritical state to a gaseous state. In this case, since there is no interface between the supercritical state and the gas, the wafer W may be dried without actuating surface tension to the pattern formed on the surface. Further, for example, when a predetermined time elapses, pipe connecting/disconnecting unit 412 of supply/recovery line 411 becomes in the separation state.

Figure 16:
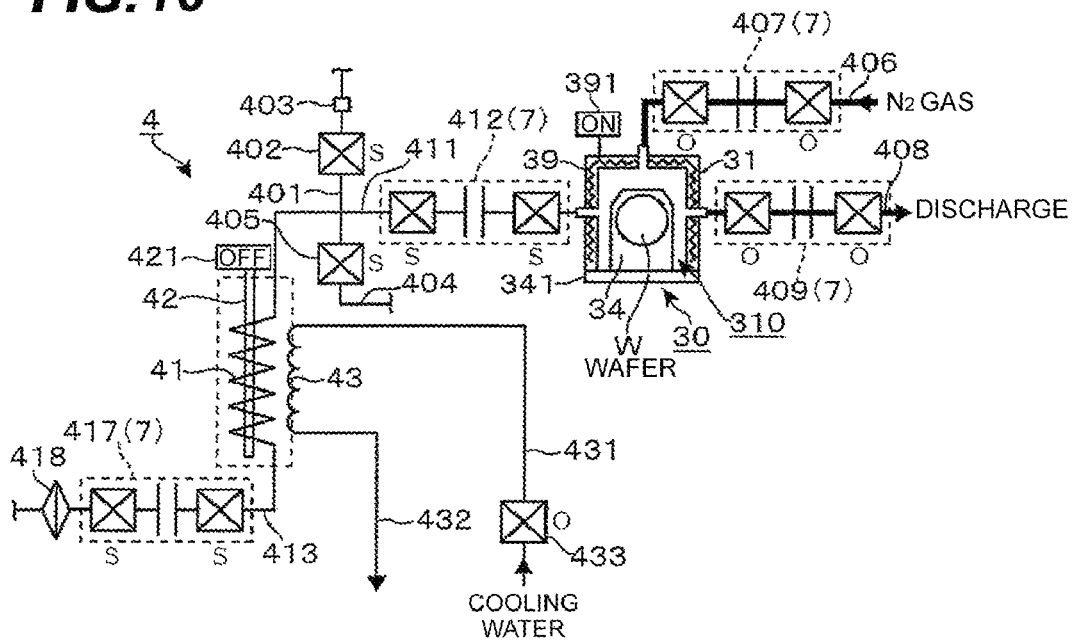
FIG. 16 is an eighth explanatory view showing the operation of the supercritical processing apparatus.

According to the above process, when the drying of the wafer W is completed, while pipe connecting/disconnecting units 407 and 409 of purge gas supplying line 406 and exhaust line 408 are connected to processing space 310 as shown in FIG. 16 in order to discharge the gaseous IPA that remains in processing space 310, $N_2$ gas is supplied from purge gas supplying line 406 to perform purging toward exhaust line 408.

When the purging is completed by supplying $N_2$ gas for a predetermined time, lock plate 38 moves down to the lower position to open the engagement state of protrusion portions 343 by lock member 35. Further, by moving wafer holder 34 to the transferring position, the wafer W completed with the supercritical processing is adsorbed and held with a carry-out pick 53 of carrying arm 5 to transfer the wafer W to second carrying mechanism 141 on wafer carrying path 142 side.

Thereafter, the wafer W is transferred to first carrying mechanism 121 through carry-out rack 43 and stored in FOUP 100 through an opposite path to that in the carry-in of the wafer W, and as a result, a series of operations for the wafer W are completed.

Meanwhile, supercritical processing apparatus 3 moves cooling jacket 43 to the retreating position and emits halogen lamp 42 to change the state of the IPA recovered in spiral pipe 41 to the supercritical state, thereby waiting for a timing for the carry-in of the next wafer W to processing chamber 31, as shown in FIG. 11.

Supercritical processing apparatus 3 according to the present exemplary embodiment provides the following effects. Pipe lines 406, 408, and 411 connected to processing chamber 31 that processes the wafer W by using the high-pressure fluid/pipe line 413 connected to spiral pipe 41 of preparation/recovery unit 4 of the high-pressure fluid is divided into first pipe member 71 and second pipe member 72 in the flowing direction of the fluid. Further, pipe members 71 and 72 are moved between the connection position and the separation position by using connecting/disconnecting mechanism 70. Herein, since opening/closing valves 741 and 742 installed in pipe members 71 and 72 are closed at the time of separating first and second pipe members 71 and 72, the high-pressure fluid in processing chamber 31 or spiral pipe 41 can be prevented from flowing into another apparatus through pipe lines 406, 408, 411, and 413.

Pipe with pipe connecting/disconnecting unit 7 can be appropriately installed by evaluating an influence on an adjacent apparatus due to the leakage of the high-pressure fluid. For example, in supercritical processing apparatus 3 of the exemplary embodiment as described above, pipe connecting/disconnecting unit 7 is not installed on discharge line 401 or purge gas supplying line 404 in the preparation/recovery unit, but pipe connecting/disconnecting unit 7 may be, of course, installed even on the pipes of lines 404 and 401. Further, contrary to this, in processing chamber 31 where pipe connecting/disconnecting unit 7 is installed on all pipe lines 406, 408, and 411, for example, pipe connecting/disconnecting unit 7 may not be installed on exhaust line 408.

In supercritical processing apparatus 3 described above, preparation/recovery unit 4 is commonly configured, but preparation/recovery unit 4 is divided into a preparation unit and a recovery unit of the high-pressure fluid, such that pipe connecting/disconnecting unit 7 may be installed to each of the supply line and the recovery line by connecting the preparation unit and the recovery unit through the supply line and the recovery line of the high-pressure fluid. Further, two preparation/recovery units 4 are installed in processing chamber 31, such that one preparation/recovery unit 4 may prepare for the high-pressure fluid and the other preparation/recovery unit 4 may recover the fluid alternatively.

Subsequently, an example of a supercritical processing apparatus 3a according to another exemplary embodiment in which the raw material becomes the high-pressure fluid state in processing chamber 31 without installing preparation/recovery unit 4 of the high-pressure fluid will be described with reference to FIGS. 19 to 22. In the figures, the same reference numerals as those used in the figures refer to the same components as those of supercritical processing apparatus 3 according to the first exemplary embodiment described with reference to FIGS. 1 to 8.

Figure 19:
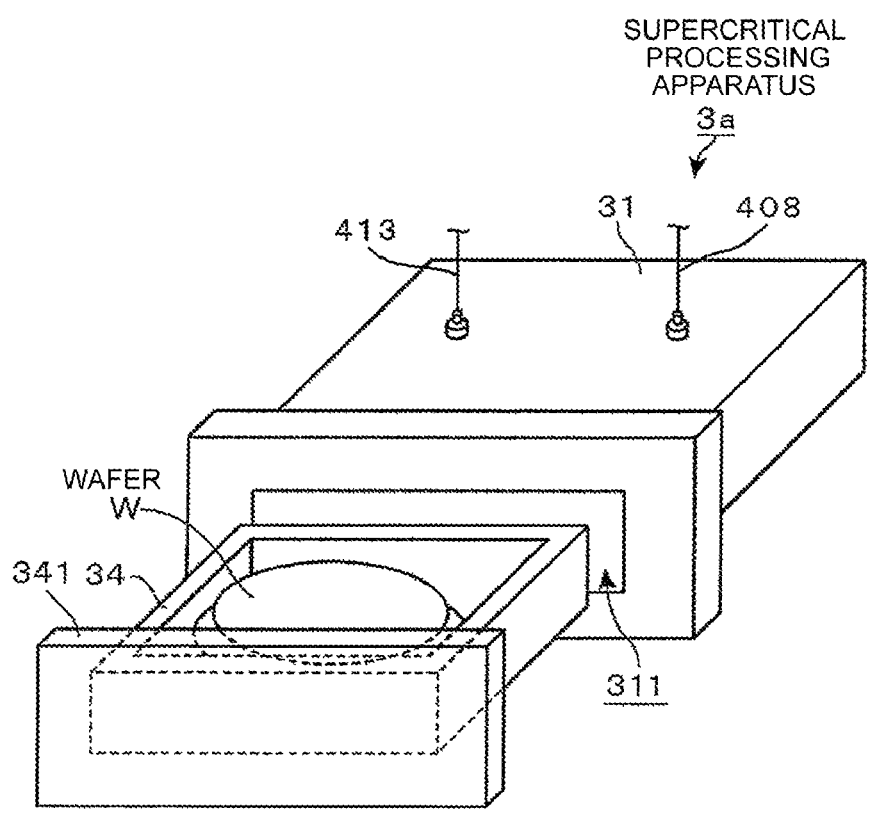
FIG. 19 is a perspective view of a supercritical processing apparatus according to another exemplary embodiment.
Figure 21:
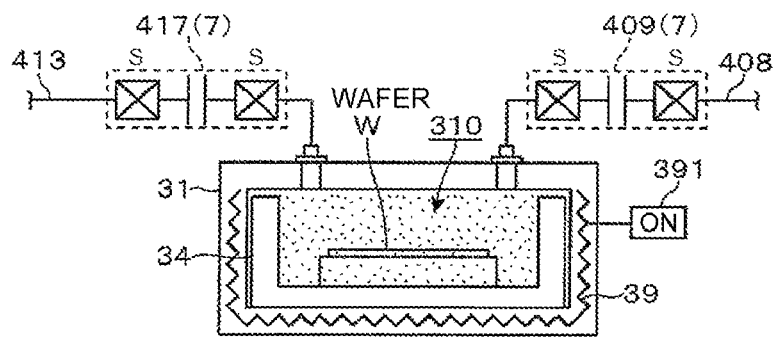
FIG. 21 is a second explanatory view showing the operation of the supercritical processing apparatus according to another exemplary embodiment.
Figure 22:
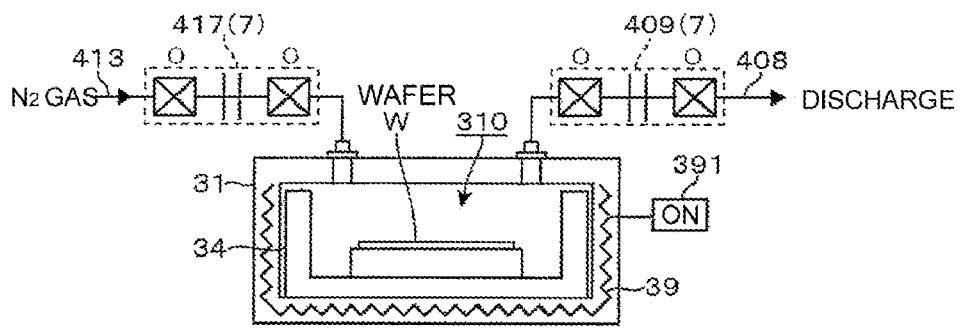
FIG. 22 is a third explanatory view showing the operation of the supercritical processing apparatus according to another exemplary embodiment.

In supercritical processing apparatus 3a according to another exemplary embodiment, as shown in FIG. 19, wafer W is carried into processing chamber 31 while being placed in a rectangular pan shaped wafer holder 34. Further, receiving line 413 that supplies liquid $CO_2$ as a liquid-state raw material and exhaust line 408 that exhausts the atmosphere in processing space 310 in processing chamber 31 are connected to processing chamber 31, and pipe connecting/disconnecting units 417 and 409 are installed in pipe lines 413 and 408 (FIGS. 20 to 22).

Figure 20:
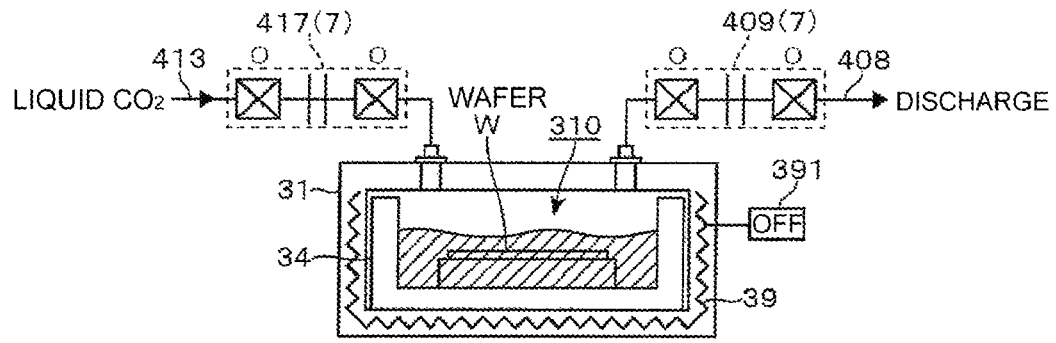
FIG. 20 is a first explanatory view showing an operation of the supercritical processing apparatus according to another exemplary embodiment.

As shown in FIG. 20, when the wafer W is carried into processing space 310, pipe connecting/disconnecting units 417 and 409 of receiving line 413 and exhaust line 408 are connected to processing space 310, such that the atmosphere in processing space 310 is exhausted from exhaust line 408 while liquid $CO_2$ is supplied from receiving line 413. Further, when liquid $CO_2$ is supplied to a predetermined height position, pipe connecting/disconnecting units 417 and 409 of receiving line 413 and exhaust line 408 are separated from processing space 310 and power supply unit 391 of heater 39 is turned ON, such that processing chamber 31 is heated until the atmosphere in processing space 310 is equal to or higher than a threshold temperature and a threshold pressure of $CO_2$ (FIG. 21). As a result, $CO_2$ in processing space 310 becomes in the supercritical state to dry the wafer W.

When the drying of the wafer W is completed after a predetermined time elapses, pipe connecting/disconnecting unit 409 of exhaust line 408 becomes in the connection state to discharge the fluid in processing space 310. Further, when the inner part of processing space 310 is depressurized, pipe connecting/disconnecting unit 409 of receiving line 413 becomes in the connection state and purge gas such as $N_2$ gas is supplied using line 413 to complete the processing by excluding $CO_2$ that remains in processing space 310.

As a modification common to supercritical processing apparatuses 3 and 3a according to the first and second exemplary embodiments, the dry processing of the wafer W using the high-pressure fluid is not limited to the case where the raw material is used as the supercritical state, and the raw material may be processed as a subcritical state. As the raw material for the high-pressure fluid, hydrofluoroether (HFE) may be used in addition to IPA or $CO_2$ as described above and other fluids may be used as well. Further, the processing of the target substrate such as the wafer W using the high-pressure fluid is not limited to the dry processing of removing the liquid attached to the target substrate, the pipe with pipe connecting/disconnecting unit 7 of the present disclosure may be used even when, for example, chemical vapor deposition (CVD) or etching is performed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus, comprising:
a processing vessel configured to perform a processing for a target substrate by using pressurized fluid that is in a supercritical state or subcritical state;
a preparation vessel configured to convert received liquid into the pressurized fluid;
a heating mechanism configured to heat the preparation vessel in order to convert the received liquid into the pressurized fluid;
a pipe supplying a raw material in a liquid state, wherein the pipe is in fluid communication with the processing vessel and the preparation vessel, and wherein the pipe is divided into a first pipe member and a second pipe member;
a connecting/disconnecting mechanism configured to move at least one of the first pipe member and the second pipe member between a connection position at which the first pipe member and the second pipe member are connected and a separation position at which the first pipe member and the second pipe member are separated; and
an opening/closing valve in each of the first pipe member and the second pipe member.

2. The substrate processing apparatus of claim 1, comprising:
a cooling mechanism configured to cool the preparation vessel.

3. The substrate processing apparatus of claim 2, wherein the preparation vessel also serves as a recovery vessel that recovers the fluid after completing the processing of the target substrate and receives recovered fluid through the pipe.

4. The substrate processing apparatus of claim 1, wherein the apparatus comprises a fluid receiving unit with a discharge path to collect and discharge fluid that flows out of the pipe when the first pipe member and the second pipe member are seperated.

5. The substrate processing apparatus of claim 4, wherein the fluid receiving unit is configured as a case that partitions the connecting/disconnecting mechanism from a surrounding atmosphere.

6. The substrate processing apparatus of claim 1, further comprising a control unit that outputs a control signal to execute a separating operation of separating the pipe members after closing both the opening/closing valves of the first pipe member and the second pipe member and a connecting operation of opening both the opening/closing valves after connecting the pipe members.

7. The substrate processing apparatus of claim 1, wherein the processing performed with respect to the substrate by using the pressurized fluid is a dry processing of the target substrate.

8. A substrate processing method, comprising:
placing a substrate in a processing vessel;
heating a fluid in a preparation vessel that is connected to the processing vessel by way of a pipe supplying a raw material in a liquid state, wherein the pipe comprises a first pipe member and a second pipe member, and wherein a connecting/disconnecting mechanism is configured to move at least one of the first pipe member and the second pipe member between a connection position at which the first pipe member and the second pipe member are connected and a separation position at which the first pipe member and the second pipe member are separated;
supplying the fluid to the processing vessel, wherein the fluid is supplied to the processing vessel through the pipe;
dividing and separating the pipe connected to the processing vessel by having the connecting/disconnecting mechanism move at least one of the first pipe member and the second pipe member such that the pipe members are in the separation position;
processing the target substrate in the processing vessel, wherein the target substrate is processed with the fluid when the fluid is in a supercritical or subcritical state; and
discharging the fluid through the pipe after completing the processing of the target substrate by having the connecting/disconnecting mechanism move at least one of the first pipe member and the second pipe member such that the pipe member are in the connection position.

9. The substrate processing method of claim 8, further comprising:
supplying liquid to the preparation vessel;
sealing the preparation vessel;
dividing and separating the pipe that connects the preparation vessel to the processing vessel;
supplying the fluid to the processing vessel form the preparation vessel by connecting the separated pipes; and
cooling the preparation vessel.

10. The substrate processing method of claim 9, further comprising:
cooling fluid discharged from the processing vessel and recovering the cooled fluid in a liquid state.

11. The substrate processing method of claim 8, wherein the processing performed with respect to the target substrate with the fluid is a dry processing of the target substrate.

12. A non-transitory computer-readable recording medium storing an executable program that, when executed, causes a computer to execute a substrate processing method used in a substrate processing apparatus processing a target substrate by using pressurized fluid, the method comprising:
heating a fluid in a preparation vessel that is connected to a processing vessel by way of a pipe, wherein the pipe comprises a first pipe member and a second pipe member, and wherein a connecting/disconnecting mechanism is configured to move at least one of the first pipe member and the second pipe member between a connection position at which the first pipe member and the second pipe member are connected and a separation position at which the first pipe member and the second pipe member are separated;
supplying the fluid to the processing vessel where a target substrate is located, wherein the fluid is supplied to the processing vessel through the pipe;
dividing and separating the pipe connected to the processing vessel by having the connecting/disconnecting mechanism move at least one of the first pipe member and the second pipe member such that the pipe members are in the separation position;
processing the target substrate in the processing vessel, wherein the target substrate is processed with the fluid when the fluid is in a supercritical or subcritical state; and
discharging the fluid through the pipe after completing the processing of the target by having the connecting/disconnecting mechanism move at least one of the first pipe member and the second pipe member such that the pipe member are in the connection position.

13. The non-transitory computer-readable recording medium of claim 12, the method further comprising:
supplying liquid to the preparation vessel;
sealing the preparation vessel;
dividing and separating the pipe that connects the preparation vessel to the processing vessel;
supplying the fluid to the processing vessel form the preparation vessel by connecting the separated pipes; and
cooling the preparation vessel.

14. The non-transitory computer-readable recording medium of claim 13, the method further comprising:
cooling fluid discharged from the processing vessel and recovering the cooled fluid in a liquid state.

15. The non-transitory computer-readable recording medium of claim 12, wherein the processing performed with respect to the target substrate with the fluid is a dry processing of the target substrate.

* * * * *